(12) United States Patent
Harris et al.

(10) Patent No.: US 6,230,105 B1
(45) Date of Patent: May 8, 2001

(54) TRANSFER IMPEDANCE MEASUREMENT INSTRUMENT SYSTEM

(75) Inventors: Cliff A. Harris, Albuquerque; Jerry T. Love, Stanley, both of NM (US)

(73) Assignee: Bolt, Inc., Albuquerque, NM (US)

( * ) Notice: Subject to any disclaimer, the term of this patent is extended or adjusted under 35 U.S.C. 154(b) by 0 days.

(21) Appl. No.: 09/489,128

(22) Filed: Jan. 21, 2000

Related U.S. Application Data

(60) Provisional application No. 60/116,777, filed on Jan. 22, 1999.

(51) Int. Cl.$^7$ .............................. G01R 15/00; G06F 19/00
(52) U.S. Cl. ................................. 702/57; 702/38; 702/58; 324/72
(58) Field of Search .................... 702/4, 33–36, 702/38, 42, 57–59, 64, 65, 75, 108–113, 115, 122, 124, 126; 324/458, 544, 627, 72

(56) References Cited

U.S. PATENT DOCUMENTS

| | | | |
|---|---|---|---|
| 4,142,143 | * 2/1979 | Daniel | 324/51 |
| 4,328,461 | * 5/1982 | Butters et al. | 324/72 |
| 4,656,595 | * 4/1987 | Hognestad | 702/38 |
| 5,256,974 | * 10/1993 | Padden | 324/458 |
| 5,414,345 | * 5/1995 | Rogers | 324/72.5 |
| 5,414,366 | 5/1995 | Rogers | 324/627 |
| 5,552,715 | 9/1996 | Rogers | 324/627 |
| 5,654,641 | 8/1997 | Query et al. | 324/529 |
| 5,999,889 | * 12/1999 | Tietsworth | 702/65 |

OTHER PUBLICATIONS

"Sandia–led research may zap old beliefs about lightning protection at critical facilities" by John German. Sandia LabNews Apr. 25, 1997, pp. 1–4.

"Rocket–Triggered Lightning Studies for the Protection of Critical Assets" by Marvin E. Morris et al. IEEE Transactions on Industry Applications, vol. 30, No. 3, May/Jun., 1994. pp. 791–804.

\* cited by examiner

*Primary Examiner*—Marc S. Hoff
*Assistant Examiner*—Manuel L. Barbee
(74) *Attorney, Agent, or Firm*—Peacock, Myers & Adams

(57) ABSTRACT

An apparatus and method for measuring the transfer impedance of a structure. Oscillator driver 20 produces a small electrical drive signal into structure 40. Field probe 30 detects the electric field produced by the drive signal and is comprised of a skinny half-dipole and fat half-dipole antenna. Fat half-dipole 34 encloses synchronous detection circuitry. Power supplies are isolated for all components. Base station 10 communicates with oscillator driver 20 and field probe 30 via wireless links 92 and 44 to control the drive signal, the synchronous detection, and to determine the transfer impedance.

73 Claims, 24 Drawing Sheets

```
┌─────────────────────────────────────────────────────────┐
│  TIMIS MANUAL MEASUREMENT                           [X] │
│ VIEW                                                    │
│   ┌─ FREQUENCY ──────┐      ┌─ HEIGHT ─────────┐       │
│   │ │1│    KHz       │      │ │1│    METERS    │       │
│   │ ┕━━━━━━━         │      │ ┕━━━━━━━━        │       │
│   └──────────────────┘      └──────────────────┘       │
│   ┌─ CURRENT CONTROL ┐      ┌─ VOLTAGE CONTROL ┐       │
│   │  RANGE  ⊙ LOW    │      │  GAIN  ⊙ LOW     │       │
│   │         ○ HIGH   │      │        ○ HIGH    │       │
│   │ MAGNITUDE │0│    │      │                  │       │
│   │ (0 TO 15) ┕━━━   │      │                  │       │
│   └──────────────────┘      └──────────────────┘       │
│   ┌─ DRIVE CURRENT ──┐      ┌─ ELECTRIC FIELD VOLTAGE ┐│
│   │ │       │ RMS    │      │ │       │ RMS          ││
│   │         MILLIAMPS│      │        MICROVOLTS/m    ││
│   └──────────────────┘      └────────────────────────┘│
│       ┌─ TRANSFER IMPEDANCE ─────────────┐            │
│       │  AMPLITUDE │       │ MILLIOHMS   │            │
│       │  PHASE     │       │ DEGREES     │            │
│       └──────────────────────────────────┘            │
│       │ MEASURE │    │ STOP │    │ EXIT │             │
└─────────────────────────────────────────────────────────┘
```

FIG-10c

```
┌─────────────────────────────────────────────────────────┐
│  TIMIS AUTOMATIC MEASUREMENT - PATH INFORMATION    [X] │
│   OPERATOR NAME                          ┌─ OK ─┐      │
│   ┌──────────────────────┐               └──────┘      │
│   │                      │               ┌─CANCEL─┐    │
│   TEST LOCATION                          └────────┘    │
│   ┌──────────────────────┐                             │
│   │                      │                             │
│   SITE                                                  │
│   ┌──────────────────────┐                             │
│   │                      │                             │
└─────────────────────────────────────────────────────────┘
```

FIG-10d

```
┌─────────────────────────────────────────────┐
│  TIMIS AUTOMATIC MEASUREMENT       _ □ ×    │
│  TEST   VIEW                                │
│     LOCATION: KIRTLAND AFB  SITE: BUILDING 123  OPERATOR: JOHN DOE │
│                                             │
│  TEST POSITION          TIMIS MESSAGES      │
│  │N6E2│                                     │
│                                             │
│  CEILING HEIGHT (METERS)                    │
│  │1│                                        │
│  ├──────────────                            │
│  ┆ ┆ ┆ ┆ ┆ ┆ ┆ ┆ ┆                          │
│                                             │
│  ┌──────────┐                               │
│  │BEGIN TEST│                               │
│  └──────────┘                               │
│                                             │
│                                             │
│  │STATUS        │12/17/99  │9:41 PM         │
└─────────────────────────────────────────────┘
```

FIG-10e

```
┌─────────────────────────────────────────────┐
│  TIMIS VIEW COMMUNICATIONS        _ □ ×    │
│  ┌─ OSCILLATOR DRIVER COMMUNICATIONS ─────┐ │
│  │                                        │ │
│  │  TRANSMISSION FROM BASE STATION        │ │
│  │  ┌──────────────────────────────────┐  │ │
│  │  │                                  │  │ │
│  │                                        │ │
│  │  RECEPTION FROM OSCILLATOR DRIVER      │ │
│  │  ┌──────────────────────────────────┐  │ │
│  │  │                                  │  │ │
│  └────────────────────────────────────────┘ │
│                                             │
│  ┌─ FIELD PROBE COMMUNICATIONS ───────────┐ │
│  │                                        │ │
│  │  TRANSMISSION FROM BASE STATION        │ │
│  │  ┌──────────────────────────────────┐  │ │
│  │  │                                  │  │ │
│  │                                        │ │
│  │  RECEPTION FROM FIELD PROBE            │ │
│  │  ┌──────────────────────────────────┐  │ │
│  │  │                                  │  │ │
│  └────────────────────────────────────────┘ │
└─────────────────────────────────────────────┘
```

FIG-10f

A. AUTOMATIC OPERATION

MEASURE X, Y, Idm, NOISE

TRANSFER IMPEDANCE MEASUREMENT INSTRUMENT SYSTEM

CROSS-REFERENCE TO RELATED APPLICATIONS

This application claims the benefit of the filing of U.S. Provisional Patent Application Ser. No. 60/116,777, entitled "Transfer Impedance Measurement Instrument System, filed on Jan. 22, 1999, and the specification thereof is incorporated herein by reference.

BACKGROUND OF THE INVENTION

1. Field of the Invention (Technical Field)

The present invention relates to measuring transfer impedance, particularly the transfer impedance of structures, to assess vulnerability to lightning.

2. Background Art

Buildings of all types and their contents are vulnerable to the ever-present threat of lightning. High-value electronics, computers, communications systems, explosives, and human life are all particularly vulnerable to the effects of lightning. While many buildings have a metallic substructure that provides some protection against the effects of lightning, it is currently unknown how most buildings will fare in protecting their contents when struck. Hospitals, banks, bunkers for nuclear weapons, shelters for explosives, and buildings that house flight-control systems can all benefit from an analysis of their susceptibility to the effects of a lightning strike.

Past experimental and analytical work to assess the ability of typical explosives shelter to protect their contents from the effects of a direct lightning strike reveal several results. First, the typical shelter of reinforced concrete is intrinsically a very effective shield against a direct lightning strike if its mesh of rebar is electrically well bonded, that is, electrically well connected, rod-to-rod, mesh-to-mesh, and roof-to-floor. This means that the shelter itself conducts nearly all the lightning energy to ground with very little spectral energy transmitted into the shelter. If not well bonded, however, the shelter is an ineffective shield, and significant electric fields can be transmitted into the shelter. Second, the conventional lightning protection systems appliqued to shelters are ineffective and conduct only a small part of the lightning energy to ground. Third, the response of the shelter to lightning can be effectively determined from known lightning characteristics and the shelter transfer impedance from the roof to the floor. The important frequency range for this transfer impedance is about 1 kiloHertz (kHz) to 1 megaHertz (MHz). Indeed, this shelter impedance is well-modeled with a simple series R/L circuit having resistance (R) in the range of milliOhms and inductance (L) in the range of tens of nanoHenries. "Rocket-Triggered Lightning Studies for Protection of Critical Assets," M. E. Morris, et al., IEEE Transactions on Industry Applications, May/June 1994; "Sandia-Led Research May Zap Old Beliefs About Lightning Protection at Critical Facilities," J. German, Sandia Lab News, Apr. 25, 1997.

Patents in related technological fields include U.S. Pat. No. 4,328,461, to Butters, entitled "Apparatus for and Method of Measuring a High Voltage Electric Field," which discloses an apparatus for measuring a high voltage electric field, but does not disclose determination of transfer impedance. This technology does not disclose a dipole antenna, nor does it apply synchronous detection such as that of the present invention as will be discussed below. U.S. Pat. No. 4,142,143, to Daniel, entitled "Lightning Ground System Attachable Admittance Testing Instrument," discloses a lightning ground testing instrument but does not determine transfer impedance, nor does it have any system elements similar to the field probe of the present invention. U.S. Pat. No. 5,256,974, to Padden, entitled "Method and Apparatus for a Floating Reference Electric Field Sensor," discloses an apparatus for sensing electric fields with a dipole antenna, but does not determine transfer impedance or measure phase. U.S. Pat. No. 5,654,641, to Query, et al., entitled "Method and Device for Testing the Effectiveness of a Lightning Ground System," discloses measuring current or the magnetic field of an exposed conductor, but does not disclose the use of synchronous detection or any system element similar to the field probe of the present invention. U.S. Pat. No. 5,414,345, to Rogers, entitled "Apparatus and Method for Low Cost Electromagnetic Field Susceptibility Testing," discloses the use of a detector probe for monitoring a signal level at a test point as an AM radio frequency carrier. This system does not determine transfer impedance, nor does it contain any system elements similar to the unique field probe of the present invention. U.S. Pat. No. 5,414,366, entitled "Electromagnetic Field Susceptibility Test Apparatus and Methods," and U.S. Pat. No. 5,552,715, both also to Rogers, entitled "Apparatus for Low Cost Electromagnetic Field Susceptibility Testing," disclose similar technologies to that of the Rogers '345 Patent and also lack the same features from the present invention. All of these patents are dissimilar from the present invention in a variety of ways. For example, none disclose the ability to determine transfer impedance (both amplitude and phase), or the use of a fat half-dipole packaging for shielding and an electromagnetically invariant antenna configuration. None disclose the ability to use low drive signals and detect extremely low electric fields. None of the aforementioned devices are extremely immune to noise, or distribute optical isolation and battery power for explosives safety. Furthermore, the implementation of the present invention is optimized for impedance frequency ranges specific to lightning susceptibility.

The past experimental work that has been performed was with natural rocket-triggered lightning that produced direct strikes upon an instrumented shelter. However, the instrumentation and control equipment for this potentially hazardous experimental work required a cumbersome instrumentation trailer. FIGS. 3a, 3b and 3c represent a simplified view of a shelter response to lightning. An actual lightning strike produces a shelter drive current, $I_d$, and an internal electric field voltage, $V_{ef}$, as illustrated in FIG. 3a. For a poorly bonded shelter, $V_{ef}$ can be high enough to damage electronics or to actuate squibs or detonators. FIG. 3b illustrates the shelter transfer impedance, $Z_s$, which analytically produces a closely similar internal field, $V_{ef}$, if a similar drive current, $I_d$, is applied to it. In FIG. 3b, $V_{ef}=Z_s I_d/h$. FIG. 3c illustrates a low drive current measurement to determine $Z_s$ where $Z_s=V_{ef}h/I_d$.

SUMMARY OF THE INVENTION (DISCLOSURE OF THE INVENTION)

The present invention is a transfer impedance measurement apparatus comprising a base station to control the transfer impedance measurement of a structure; an oscillator driver that communicates with the base station for producing a small electrical drive signal into the structure; and a field probe that communicates with the base station, for detecting the electric field of the structure produced by the electrical drive signal. Preferably, the base station and oscillator driver are in communication via a wireless link. The base station also preferably is in communication with the field probe via a wireless link. The field probe is capable of detecting electric fields ranging from approximately 1 to 10,000 microvolts/meter. The field probe and base station together are capable of detecting electric fields from surrounding noise having spectral energy up to approximately 100 times the magnitude of the electric field signal.

The apparatus also has isolated power supplies for each of the base station, oscillator driver, and field probe. Each of these isolated power supplies can be either batteries, pneumatically driven generators powered by gas via non-conducting tubing, hydraulically driven generators powered by non-conductive fluid via non-conducting hoses, photo cells powered by light via fiber optics, or fuel cells. The apparatus also has means for generating a synchronous timing signal between the base station and field probe to permit synchronous detection of the electric field by the field probe.

The base station of the apparatus is comprised of a computer for storing and executing software; software for control of the transfer impedance measurement; and a communications interface for communicating with the oscillator driver and field probe. The base station can further comprise a synchronization source to provide a synchronous timing signal between the base station and field probe to permit synchronous detection of the electric field by the field probe. The base station also has means for determining transfer impedance phase, as well as amplitude.

The oscillator driver of the apparatus drives an electrical signal that is approximately one-millionth the magnitude of lightning. Preferably, the oscillator driver drives an electrical signal that is less than approximately 500 milliamps, and more preferably 10 to 400 milliamps. The electrical drive signal voltage is preferably less than approximately 28 volts. The apparatus further comprises at least one isolated regulator for each of the oscillator driver and fuel probe. The oscillator driver preferably drives an AC electrical signal having a frequency range specific to lightning susceptibility for determining transfer impedance as a function of frequency, and preferably the frequency range is between approximately 1 kHz and 1 MHz.

The components of the oscillator driver are an oscillator to produce the electrical drive signal at selected frequencies; a driver to amplify the electrical drive signal coming from the oscillator; a communications interface for communication with the base station; a microcontroller to process and enact commands received from the base station, to send data to the base station, and to control the electrical drive signal; and a multiplexer, resistance, and a peak detector for determining the measured electrical drive signal. The oscillator driver can further comprise a synchronization source to provide a synchronous timing signal between the base station and field probe to permit synchronous detection of the electric field by the field probe. The oscillator driver also can comprise a phase measurement circuit to be used by the base station in calculating transfer impedance phase.

The field probe preferably comprises an electromagnetic shield for containing a detector and is preferably an electromagnetically invariant system.

The field probe of the apparatus can alternatively comprise an antenna capable of measuring parameters such as normal electric field near a conducting ground plane, magnetic fields, directly connected currents, directly connected voltages, and electromagnetic fields. The field probe preferably comprises a dipole antenna which consists of a skinny half-dipole antenna and a fat half-dipole antenna.

The present invention is also a method of measuring transfer impedance and comprises the steps of driving a small electrical drive voltage into a structure, with an oscillator driver; detecting the electric field of the structure produced by the electrical drive signal with a field probe; controlling the transfer impedance measurement with a base station; and determining the transfer impedance of the structure from the electric field detection with a base station. The method further comprises the step of communicating between the base station and oscillator driver with a wireless link and communicating between the base station and field probe with a wireless link. Detecting the electric field of the structure produced by the electrical drive signal with the field probe comprises detecting the electric fields ranging from approximately 1 to 10,000 microvolts/meter.

Detecting the electric field of the structure can comprise detecting electric fields from noise having spectral energy up to approximately 100 times the magnitude of the electric field signal, with the field probe and the base station. The method can also include the step of isolating the power supplies for each of the base station, oscillator driver, and field probe. Isolating the power supplies comprises isolating the power supplies by using at least one power supply for the base station, oscillator driver, and field probe selected from the group of power supplies consisting of batteries, pneumatically driven generators powered by gas via non-conducting tubing, hydraulically driven generators powered by non-conducive fluid via non-conducting hoses, photo cells powered by light via fiber optics, and fuel cells.

Detecting the electric field of the structure preferably comprises synchronously detecting the electric field. Controlling the transfer impedance measurement with a base station and determining the transfer impedance of the structure from the electric field detection with the base station comprises storing and executing software on a computer; controlling the transfer impedance measurement with the software; and communicating with the oscillator driver and field probe. The method can further comprise the step of providing a synchronous timing signal between the base station and field probe to permit synchronous detection of the electric field by the field probe. Determining the transfer impedance of the structure from the electric field detection with a base station comprises determining transfer impedance amplitude and phase of the structure.

Driving a small electrical drive signal into a structure with an oscillator driver preferably comprises driving an electrical signal that is approximately one millionth the magnitude of lightning. Preferably, the step of driving an electrical signal that is approximately one millionth the magnitude of lightning comprises driving an electrical signal that is less than approximately 500 milliamps, and more preferably 10 to 400 milliamps. Preferably, this signal is less than approximately 28 volts.

The method additionally comprises the step of isolating at least one regulator for each of the oscillator driver and field probe. Driving the small electrical drive signal into the structure further preferably comprises driving an AC electrical signal having a frequency range specific to lightning susceptibility to determine transfer impedance as a function of frequency, and preferably the frequency ranges between approximately 1 kHz and 1 MHz.

The step of driving a small electrical drive signal into the structure comprises producing the electrical drive signal at selected frequencies with an oscillator; amplifying the electrical drive signal with a driver; communicating with the base station via a communication interface; processing and enacting commands received from the base station, sending data to the base station, and controlling the electrical drive signal, with a microcontroller; and determining the measured electrical drive signal with a multiplexer, resistance, and a peak detector. Optionally, the method further comprises the step of providing a synchronous timing signal between the base station and field probe to permit synchronous detection of the electric field by the field probe.

Detecting the electric field of the structure with a field probe preferably comprises detecting the electric field with an electromagnetically invariant system. Detecting the electric field also preferably comprises shielding a detector with an electromagnetic shield. The method optionally further comprises the step of measuring parameters such as normal electric fields near a conducting ground plane, magnetic fields, directly connected currents, directly connected voltages, and electromagnetic fields. Detecting the electric field of the structure produced by the electrical drive signal with a field probe preferably comprises detecting the electric field of the structure with a dipole antenna. Preferably, detecting the electric field of the structure produced by the electrical drive signal is accomplished with a skinny half-dipole antenna and a fat half-dipole antenna.

A primary object of the present invention is to provide a system that is distributed so that the source of the drive signal and of the synchronous timing signal is isolated from the synchronous detection circuitry, or field probe, by noise immune communication channels and isolated power sources. The analysis subsystem is also isolated.

Another object of the present invention is to package sensitive detection circuitry and the power source for the field probe within the antenna in a fat half-dipole.

Still another object of the present invention is to eliminate potential spectral energy conduction paths to the inside of the structure and to the structure roof by using wireless links such as fiber optics.

Yet another object of the present invention is to provide isolated power sources for all subsystems, such as battery power, to limit the spectral energy that the assembled system might inject into the structure under fault conditions.

A primary advantage of the present invention is that spurious interactions between the source circuitry and the detection circuitry are eliminated.

Another advantage of the present invention is that the field probe provides shielding of the sensitive detection circuitry from environmental noise.

Still another advantage of the present invention is that the antenna/detection system, or field probe, is an electromagnetically invariant system that can be calibrated and deployed independent of field conditions.

Still another advantage of the present invention is that the wireless links enhance explosives safety.

Yet another advantage of the present invention is that the system can use either an in-phase/quadrature algorithm or can maximize the detected signal as a function of phase.

Still yet another advantage of the present invention is that it is easily used by semi-skilled field technicians.

Another advantage of the present invention is that it is mechanically and electrically stable and robust.

Still another advantage of the present invention is that it is manufacturable.

And yet still another advantage of the present invention is that it readily allows for assessment of multiple locations within the structure.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings:

FIG. 3a shows a lightning strike upon a structure and the resulting drive current and internal electric field voltage;

FIG. 3b illustrates the transfer impedance $Z_s$ that produces a similar internal electric field voltage when a similar drive current is applied as in FIG. 3a;

FIG. 3c illustrates a low drive current measurement to determine the transfer impedance of FIG. 3b;

FIG. 10c shows the graphical user interface for manual measurement;

FIG. 10d shows the graphical user interface for automatic measurement path information;

FIG. 10e shows the graphical user interface for automatic measurement;

FIG. 10f shows the graphical user interface for viewing communications;

FIG. 14b is a continuation of the software flow diagram of FIG. 14a;

DESCRIPTION OF THE PREFERRED EMBODIMENTS

(BEST MODES FOR CARRYING OUT THE INVENTION)

Figure 1:
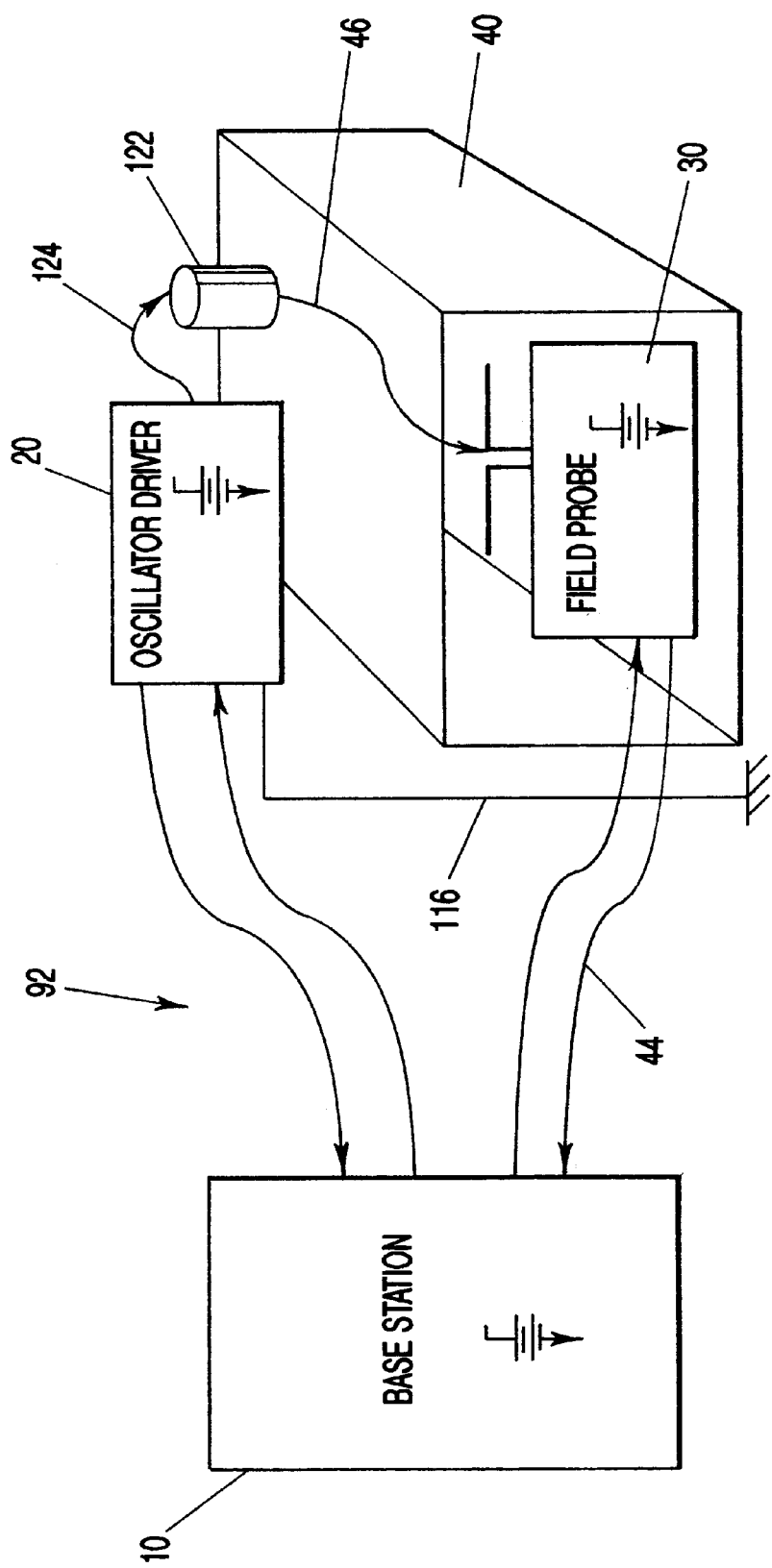
FIG. 1 provides an overview of the basic components of one embodiment of the apparatus according to the present invention.

Three simple illustrations from experimental work with rocket-triggered lightning and their implications have prompted the development of the present invention for a transfer impedance measurement instrument system (TIMIS). TIMIS is a critical and unique technology in determining the intrinsic lightning safety of storage structures, and all structures, and incorporates the following.

An accurately determined transfer impedance, $Z_s$, provides the necessary structure characteristics to determine $V_{ef}$ because lightning strike characteristics, which determine the drive current $I_d$, are well-known. Analysis using structure design drawings cannot adequately determine $Z_s$ because the rebar bonding effectiveness is unknown. Thus, an experimental method must be used to determine $Z_s$. For personnel and explosive safety, this method must use drive currents about one-millionth the magnitude of an actual lightning strike. Because the drive current, $I_d$, and resulting electric field voltage, $V_{ef}$, must be low, an extremely sensitive and noise immune measurement technique is required. Furthermore, because thousands of structures require testing and analysis, and many will require additional rebar bonding, TIMIS is portable, simple to field and can quickly and accurately determine $Z_s$.

TIMIS is primarily used for measuring the transfer impedance of structures or storage structures, a measurement that is critical to assessing their vulnerability to lightning. Together with analytical methods, this measurement information is used to quantify the response of the buildings for protection of hazardous materials, including explosives, electronics, and personnel from lightning and to develop recommendations for improvement. As will be described, such a measurement requires an instrumentation system that extracts extremely low spectral energy signals from a noisy background environment while meeting rigorous explosive safety requirements. TIMIS achieves all of these requirements and provides capability for other measurements and other applications. TIMIS is both an enduring and powerful measurement concept.

In order to measure structure transfer impedance, the transfer impedance measurement instrument system (TIMIS) of this invention is designed to meet certain general system requirements. The transfer impedance is preferably measured in the frequency range of approximately 1 kHz to 1 MHz, and is measured between the structure, typically the roof, and the storage area within the structure, thereby producing a frequency response. Preferably, the transfer impedance amplitude has an accuracy of ±10% and the transfer impedance phase has an accuracy of ±10% of the building as a function of frequency. The drive current amplitude to the structure and the electric field voltage amplitude within the structure are preferably a function of frequency. These measurements are preferably made at several locations within the structure and the transfer impedance is determined for each location.

In order to maintain rigorous explosive safety standards, preferably less than approximately 500 milliamps of drive current is applied to the structure, preferably the roof. Further, all TIMIS internal and drive voltages are preferably less than approximately 28 volts. No metallic conductors penetrate the structure for power, communication, or other reasons. Furthermore, no metallic conductors are used between the external drive on the roof and the base station used for data capture and analysis.

TIMIS is also designed to work in high noise environments. The structures, by their nature, pick up numerous environmental noise sources such as power lines, communication signals like radio and television, etc. To achieve rigorous safety standards, the drive signals are low with respect to this environment. The measurement antenna/field probe detects measurement signals from 1 to 10,000 microvolts/meter. TIMIS extracts this information from noise that can have spectral energy approximately 10–100 times higher than the measurement signal.

Overview of TIMIS

Attention is now directed to the figures. FIG. 1 is an overview of the basic subsystems of the TIMIS according to the present invention. Active-integrated field probe 30 measures the internal electric field of structure 40, which can be a structure for any type of material such as explosives, high-value electronics, control systems, computer systems, etc. Oscillator driver 20 drives current into structure 40 and also generates the synchronous timing signal. Base station 10 controls the measurement, as well as acquires, analyzes, stores, and displays data. Communications link 92 between oscillator driver 20 and base station 10 is preferably wireless and most preferably is fiber optic cables. Communications link 44 between base station 10 and field probe 30 is also preferably wireless and comprised of fiber optics. Oscillator driver 20 provides a drive current through drive current conductor 124 and structure roof attachment 122 and ground conductor 116, which then sends a transmitted electric field signal shown at 46 to field probe 30. These subsystems are all preferably battery powered with enclosed rechargeable battery packs, and communicate via wireless communication links, preferably fiber optic links, to satisfy safety requirements and to improve noise immunity. Although the wireless link technology of choice, but not necessity, is fiber optics, and the following description will speak of fiber optics, other wireless technologies can be used. For example, infrared or radio frequency (RF) links, indeed other wireless technologies, can be used for application in TIMIS.

Base station 10 is preferably comprised of a personal computer, custom software for data acquisition, data analysis and system control, a battery pack, communication interfaces, and shielding and grounding. Oscillator driver 20 preferably comprises an electronics module having an oscillator to produce the frequency of choice and to provide a sync source, a current driver, current measurement, and controller, a battery pack, shielding and grounding. Active-integrated field probe 30 preferably comprises an antenna, a synchronous electric field detector having a pre-amplifier, a detector, and a controller, a battery pack, shielding and grounding.

Figure 2:
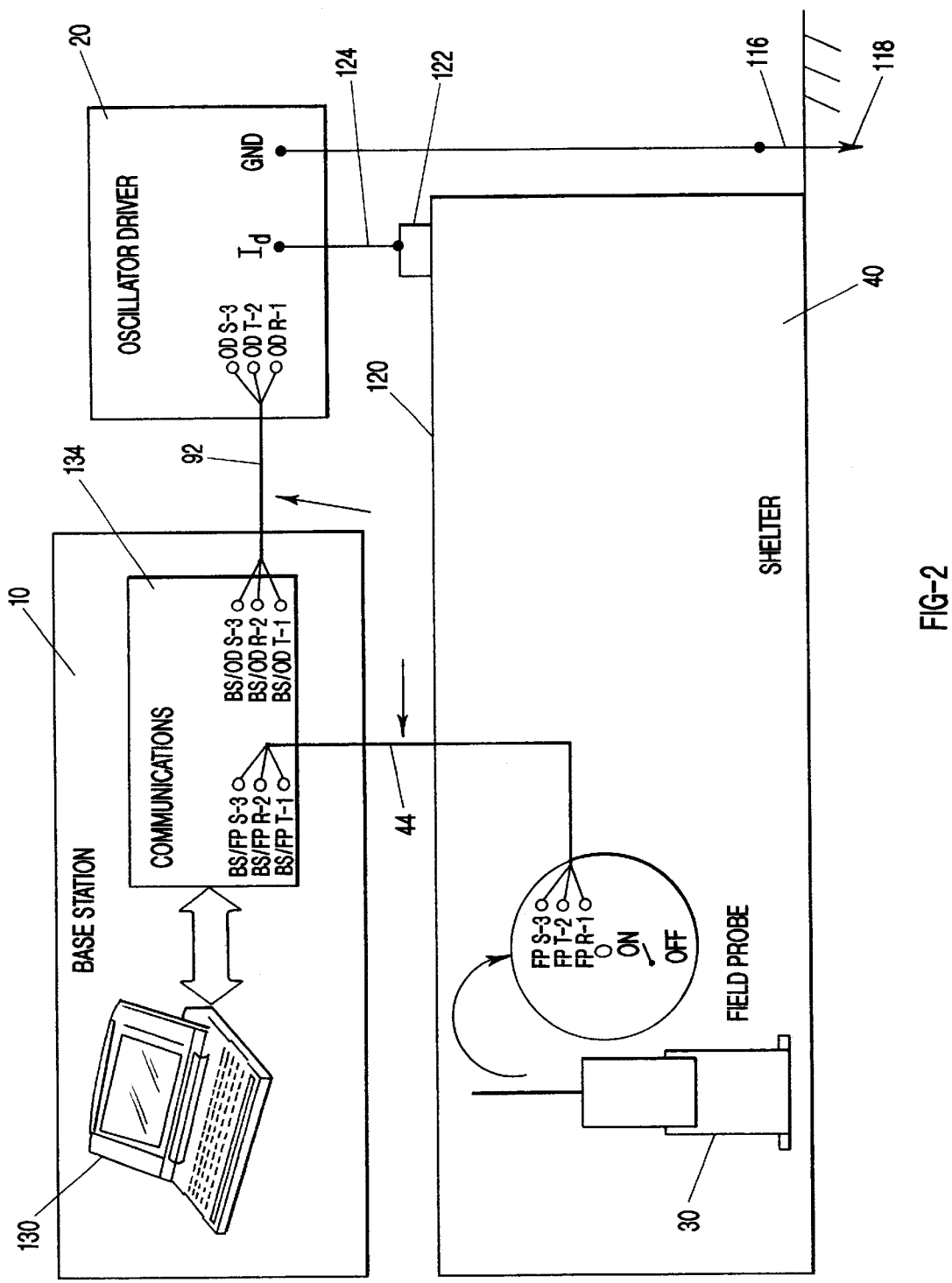
FIG. 2 shows a block diagram of the base station, oscillator driver, field probe, structure, and communications interfaces of the apparatus according to the present invention.
Figure 3:
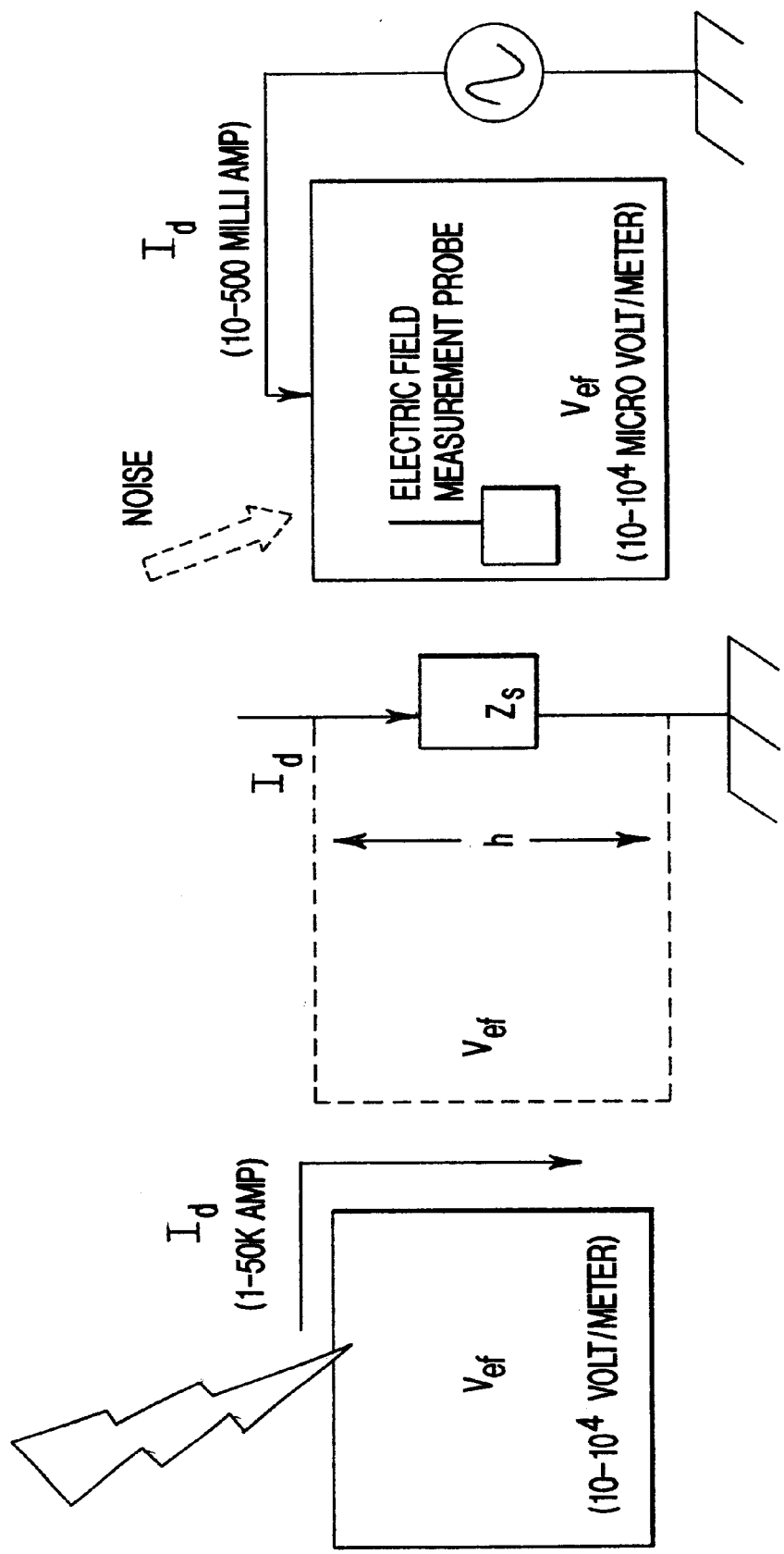

FIG. 2 also shows the subsystems of TIMIS wherein base station 10 comprises a personal computer (PC) 130, such as a laptop for portability, and communications interface 134 which has communications link 44 and communications link 92 to field probe 30 and oscillator driver 20, respectively. Oscillator driver 20 produces drive current via drive current conductor 124 through structure roof attachment 122 of structure roof 120. Ground conductor 116 grounds oscillator driver 20 to earth via ground stake 118.

Figure 4:
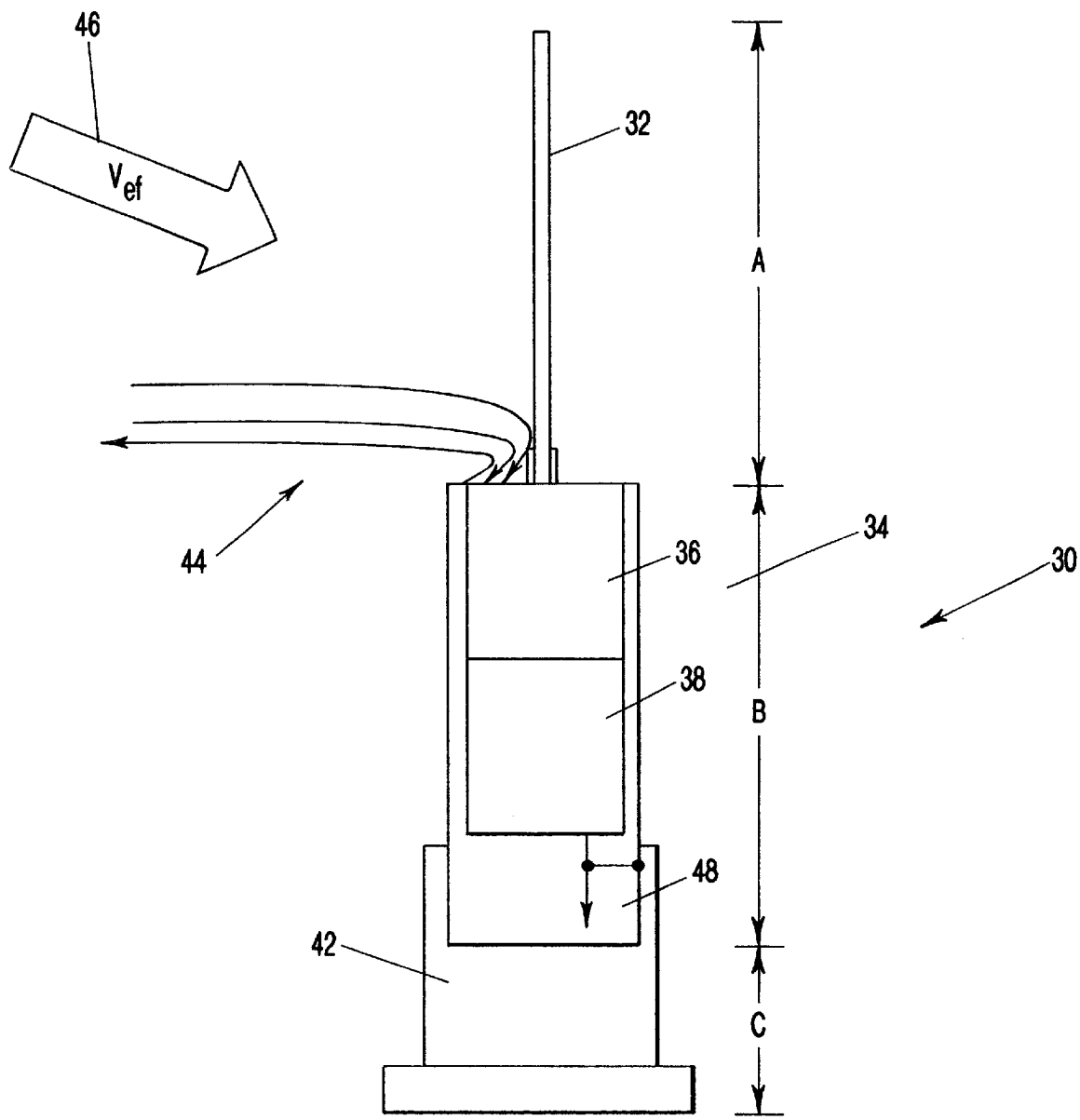
FIG. 4 is a mechanical schematic of the field probe for the apparatus according to the present invention.

FIG. 4 provides a mechanical schematic of field probe 30. Field probe 30 is comprised of "skinny" half-dipole antenna 32, "fat" half-dipole antenna 34, and field probe stand 42. Fat half-dipole 34 is preferably a sealed metal tube that is approximately six inches in diameter. The field probe subsystem is the core of TIMIS and provides superior technical performance for the overall system. Field probe 30 is a dipole antenna comprising the skinny half-dipole 32 has length (A) of approximately 0.5 meters and the fat half-dipole 34 has length (B) of approximately 0.5 meters. Skinny half-dipole 32 can be a standard, insulated whip antenna. The distance (C) from the base of field probe stand 42 to the bottom of fat half-dipole 34 is approximately 0.5 meters minimum. Fat half-dipole 34 encases and shields synchronous electric field detector 36 and power supply 38 which are both grounded to fat half-dipole 34. Preferably, power supply 38 is a rechargeable battery pack. By including synchronous electric field detector 36 and power supply 38 within the fat half of the dipole antenna making up field probe 30, intrinsic shielding is provided which rejects environmental noise. This packaging arrangement also provides a stable measurement of the electric field of structure 40 as field probe 30 is moved about structure 40 while under test. This is an improvement over other instrument systems wherein the antenna is typically interconnected externally to electronics and power sources, and wherein the physical placement of these parts relative to one another influences and potentially degrades an electric field measurement. Communications link 44, transmitted electric field signal 46, and the non-conducting and telescoping field probe stand 42, are all shown peripheral to field probe 30. Common ground 48 is shown for fat half-dipole 34, synchronous field detector 36, and power supply 38.

Figure 5:
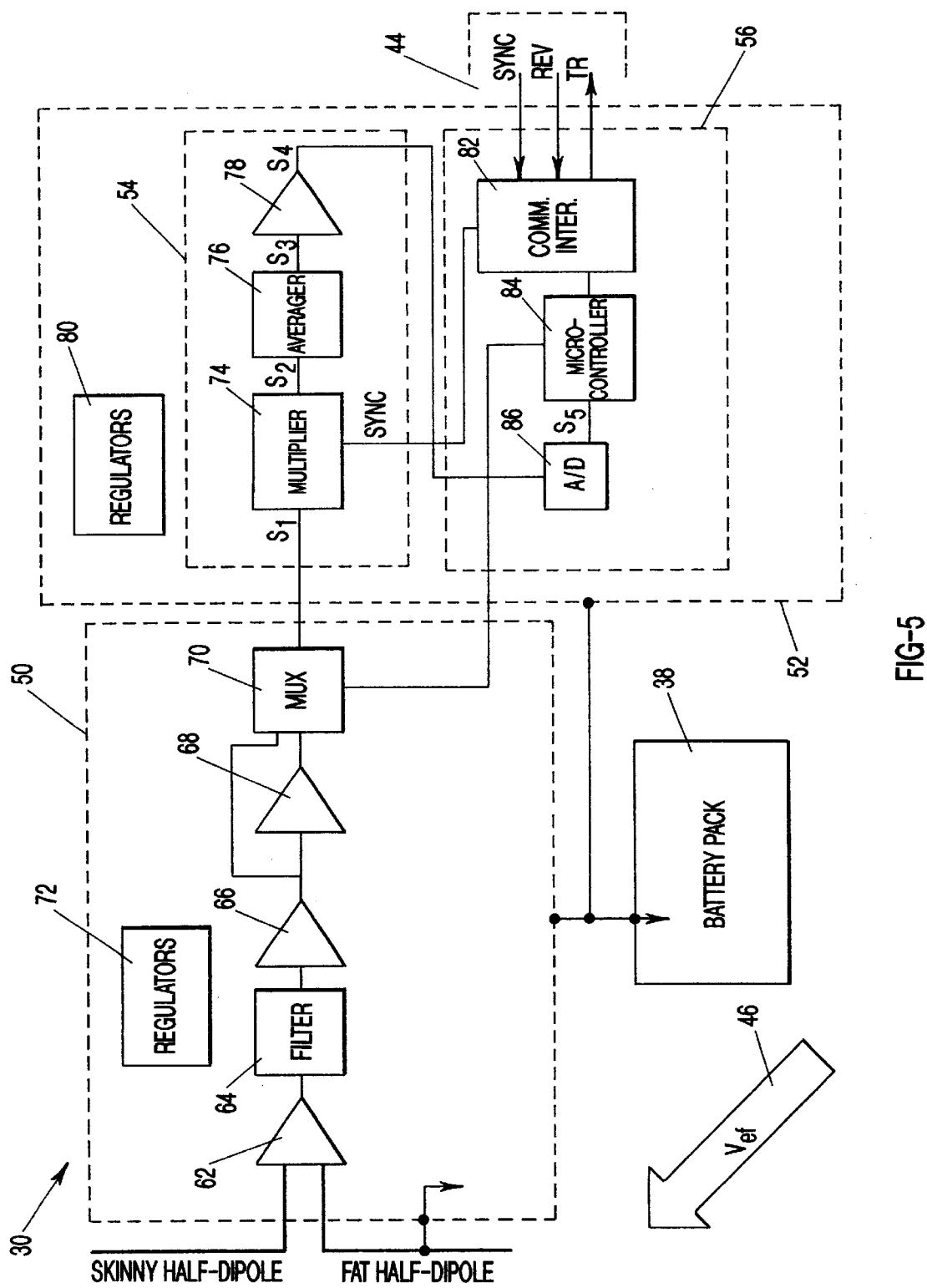
FIG. 5 is a functional/electrical schematic of the field probe for the apparatus according to the present invention.

A functional/electrical schematic for field probe 30 is shown in FIG. 5. Synchronous field detector 36, shown in FIG. 4, consists of two electronic sub-modules, pre-amplifier 50 and detector/controller 52. The detector is shown generally at 54 and the controller is shown generally at 56. Pre-amplifier 50 and detector/controller 52 are each packaged in separate shielded compartments shown as dashed lines in FIG. 5. Pre-amplifier 50 and detector/controller 52 have separate regulators shown at 72 and 80 to reduce noise and undesired coupling. Both pre-amplifier 50 and detector/controller 52 share a common ground with power supply 38, preferably a battery pack, and fat half-dipole 34.

Pre-amplifier 50 has three stages of amplification shown at 62, 66 and 68. The composite gain of these stages is either 200 or 2,000, depending on the setting of multiplexer 70 for low gain or high gain. Pre-amplifier 50 also has band pass filter 64. Band pass filter 64 rejects signals preferably below 1,000 Hz and above 1,000 kHz. Therefore, band pass filter 64 rejects AC power noise, e.g., 60 Hz and harmonics thereof, and radio/television transmission noise such as greater than 1,000 kHz. One of the final two stages of amplification, 66, 68, are presented to detector 54 via multiplexer 70 which is switched by microcontroller 84 of controller 56. These pre-amplifier gains, producing the pre-amplified signal shown as $S_1$, have been selected to allow measurement of both well-shielded structures that produce low electric fields, as well as poorly shielded structures which produce high electric fields.

Controller 56 preferably includes a single chip microcontroller 84 with embedded firmware. Controller 56 selects the appropriate gain under direction from base station 10, shown in FIGS. 1 and 2, for $S_1$ and sets multiplexer 70 so that $S_1$ is within the range of multiplier 74. $S_1$ is then multiplied with the square wave sync signal that is generated by oscillator driver 20 also at the direction of base station 10 to produce the signal $S_2$. See FIGS. 1 and 2. This in-phase digital sync signal is received from oscillator driver 20 via communication interface 82. Then $S_2$ is averaged via averager 76 to produce the detected signal $S_3$. Next, $S_3$ is amplified at 78 and converted from an analog signal shown as $S_4$ to a digital signal shown as $S_5$ by analog-to-digital (A/D) converter 86. Preferably, A/D converter 86 is a 12 bit A/D converter. Controller 56 then processes this interim measurement $S_5$ and transmits it to base station 10. The in-phase interim measurement is designated "X" in the software for base station 10 and "x" in the synchronous detection discussion below.

The composite gain of multiplier 74, averager 76, amplifier 78, and A/D converter 86 is approximately fifty. Therefore, the total synchronous electric field detector 34 gain is either approximately 10,000 or 100,000, depending upon the setting for low gain or high gain on multiplexer 70. This provides enough range for field probe 30 to process signals of approximately 0.1 to 1,000 microvolts at the pre-amplifier input. If there were an antenna loss of 1/10, the range of electric field voltage, $V_{ef}$, is about 1 to 10,000 microvolts/meter.

Base station 10 shown in FIGS. 1 and 2, then shifts the digital sync signal by 90° (¼ period), which is the quadrature phase sync signal generated by oscillator driver 20, and the measurement is repeated for the second interim measurement, designated "Y" in the base station software and "y" in the synchronous detection discussion. These two interim measurements, X and Y, together with calibration data, provide the desired amplitude and phase measurement of the electric field, $V_{ef}$, at a selected frequency as calculated in base station 10 and as will be discussed below:

$$z = \sqrt{x^2 + y^2}$$

$$|V_{ef}| \alpha z$$

$$\varphi_{ef} = -\arctan\left(\frac{y}{x}\right) - \varphi_p$$

Where $\phi_p$ is the phase shift through the preamp, z is the transfer impedance, and $\phi_{ef}$ is the phase shift of the electric field.

For extended TIMIS applications, skinny half-dipole 32 is removed and other antennas/sensors are attached, for example a magnetic field sensor or a direct-connection current-probe or voltage-probe. The direct-connection voltage-probe is attached to structure 40 when access points are available. Removing skinny half-dipole 32 also provides access to TIMIS for field calibration checks and instrument troubleshooting.

Figure 6:
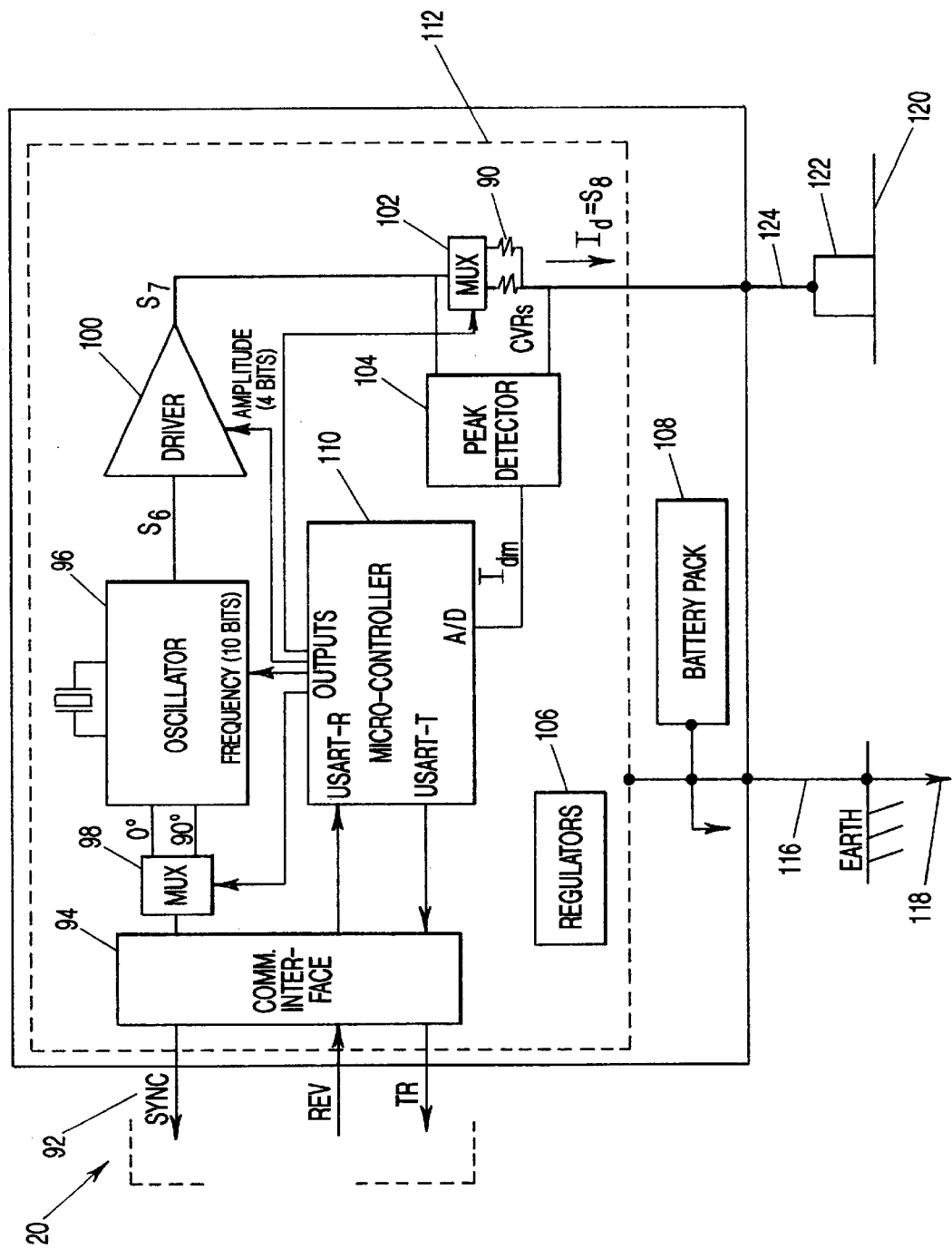
FIG. 6 is a functional/electrical schematic of the oscillator driver for the apparatus according to the present invention.

Oscillator driver subsystem 20 is depicted in the functional/electrical schematic of FIG. 6. Oscillator driver 20 receives sync signal, frequency, voltage amplitude and current viewing resistor (CVR) 90 commands from base station 10, via communication interface 94 and generates and measures the drive current, $I_d$, to structure 40. See also FIGS. 1, 2, 4, and 5. Base station 10 commands are processed and enacted by microcontroller 110, which is preferably a single chip microcontroller with embedded firmware. The drive current electrically excites structure 40 and thus produces the internal electric field, $V_{ef}$, which is detected by field probe 30.

Oscillator 96, which may be crystal controlled, generates two synchronized signals: the sinusoidal voltage, $S_6$, and the square-wave sync signal. Base station 10, shown in FIGS. 1 and 2, commands both the frequency and phase relationship, either 0° or 90°, of these synchronized signals. $S_6$ is amplified at driver 100 to produce the "drive current voltage" shown as $S_7$, and subsequently to produce the drive current, $I_d = S_8$. $I_d$ results from applying the variable amplitude sinusoidal-voltage, that is preferably 0 volts as well as 15 equal steps of voltage from approximately 3 to 20 volts, $S_7$, to the composite load: $CVR + Z_s + R_9$, where $R_g$ is the resistance from the ground conductor to the structure floor. $I_{dm}$ is the uncalibrated measured amplitude of $I_d$. The multiplexer, 102, CVR 90 and peak detector 104 determine $I_{dm}$. The measurement $I_{dm}$ is preferably converted to an 8-bit digital format by microcontroller 110 and is communicated to base station 10 via communication interface 94. Also, the CVR in combination with power supply 108, which is preferably a ±24-volt, and a +12-volt battery pack, limits $I_d$ to within explosive safety limits.

Using the measurement $I_{dm}$ and interim measurements x and y from field probe 30, base station 10 adjusts $S_7$ to produce the desired drive current and electric field voltage. The drive current is applied to structure 40, shown in FIGS. 1 and 2, via drive current conductor 124 through structure roof attachment 122 to structure roof surface 120, and via ground conductor 116 and ground stake 118. Thus, the internally transmitted electric field is produced in synchronization and at a frequency and drive current known to base station 10. This information, together with the detection information produced by field probe 30, allows base station 10 to calculate the transfer impedance amplitude and phase at a single frequency. Repeating this measurement at several frequencies under control of base station 10, discussed below, provides the complete transfer impedance function of structure 40.

Electronics submodule 112 of oscillator driver 20, regulators 106, and power supply 108 are preferably housed in a metallic enclosure for noise protection. Microcontroller 110 automatically sets the drive current equal to zero after several minutes of no communications in order to preserve the battery charge of power supply 108. The range for the drive current is approximately 10 to 400 milliamps. The high end of this range is clearly a function of $Z_s + R_g$.

The field probe and oscillator driver power supply of the present embodiment is comprised of suitable arrays of storage batteries to produce the required voltages for operational period of continuous use of over eight hours. Alternatively, any power supply that would provide the required voltages and power for continuous operation for over eight hours without requiring a metallic connection to the field probe or the oscillator driver would be suitable and may even be advantageous in reducing the packaging volume. Examples of other suitable power supplies would be (a) pneumatically driven motor/generator systems powered by gas driven through non-conducting, dielectric tubing, (b) hydraulically driven motor/generator systems powered by non-conductive fluid driven and discharged through non-conducting, dielectric hoses, (c) photocells powered by light delivered through fiber optics from a suitable optical source such as a laser diode, and (d) fuel cells powered by suitable gaseous or liquid energy sources inside or outside the field probe and/or oscillator driver.

Figure 7:
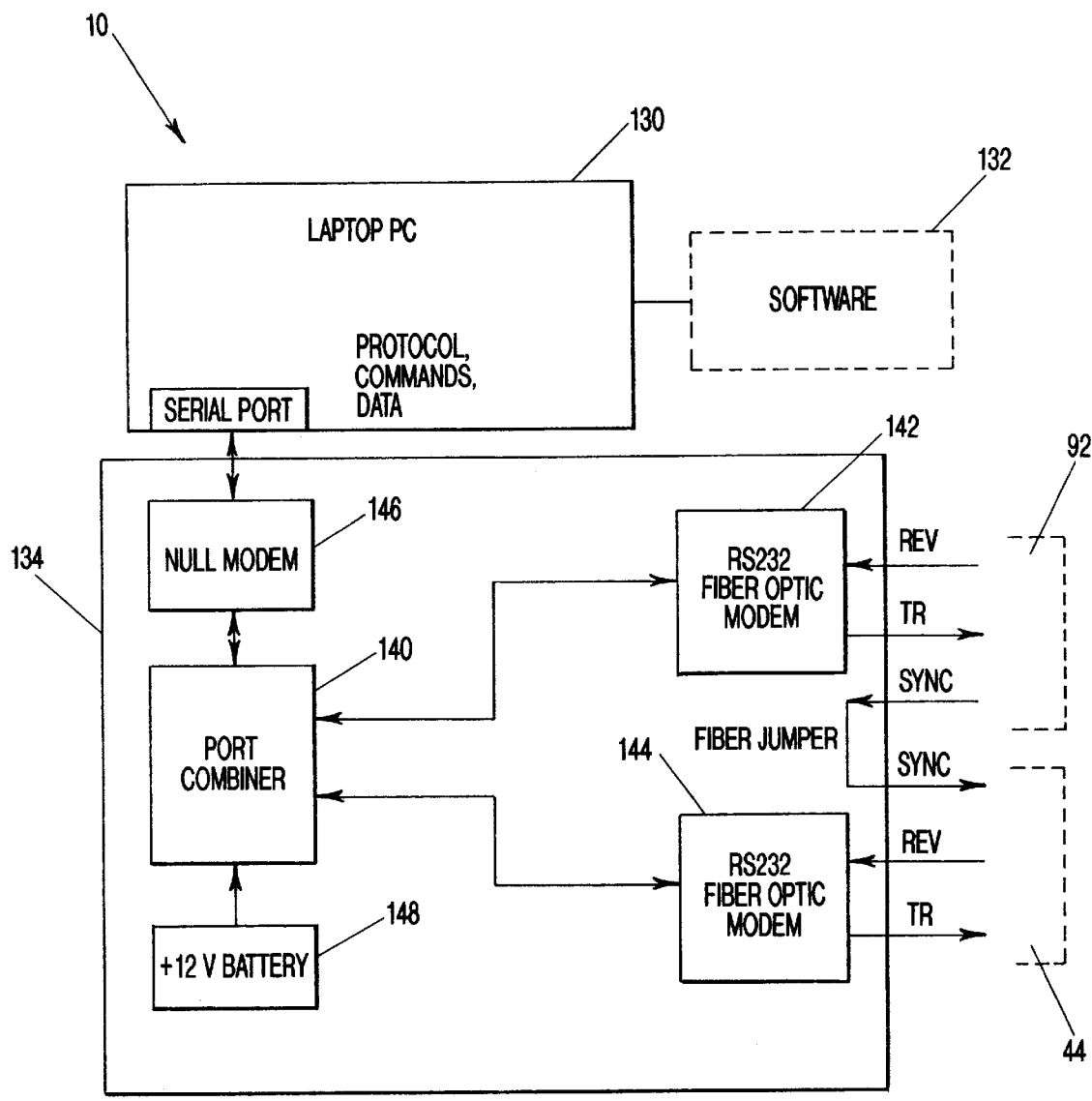
FIG. 7 is a functional/electrical schematic of the base station for the apparatus according to the present invention.

FIG. 7 is a functional/electrical schematic of base station 10. Base station 10 consists of these illustrated physical elements as well as the TIMIS software. PC 130, which can be a laptop for portability, stores and executes software 132 and communicates with oscillator driver 20 and field probe 30 (shown in FIGS. 1 and 2) via the serial port and through communication interface 134. Communication interface 134 is preferably a commercially based communication interface. Interface 134 consists of port combiner 140, two fiber optic modems, 142 and 144, a fiber jumper, null modem 146, and power supply 148, preferably a +12-volt battery. Base station 10 poles both oscillator driver and field probe; their firmware determines which is being addressed and the appropriate one responds. Numerous commercial options are available for all this commercial hardware.

The three subsystems, field probe 30, oscillator driver 20, and base station 10, FIGS. 1, 2, 4–7, together with their fiber optic links and integrated control, provide a distribution of system features including signal generation, signal detection, and signal recording and analysis, that is uniquely optimized to provide the required measurement sensitivity, accuracy, and noise immunity, while meeting safety requirements. The system features are distributed to enhance the distinctive advantages of each subsystem and of the overall system operating in concert. In summary, this provides an integrated system that includes the following features:

The integrated and crucial shielding provided by field probe 30 is preserved by fiber optic link 44 between base station 10 and field probe 30. This link, as discussed, is also crucial to explosive safety. Similarly, fiber optic link 92 between base station 10 and oscillator driver 20 protects the system from environmental noise, which is higher outside the structure. This link also enhances explosive safety. Use of shielded and/or integrated batteries in each subsystem enhances both noise rejection and explosive safety. It also provides a known limit on the total energy the system can release in a fault condition.

The functions and electronics to implement these functions that are distributed to both field probe 30 and oscillator driver 20 have been carefully selected to maximize overall performance. The emphasis in field probe 30 and oscillator driver 20 is on minimum required electronics to realize their function. This minimizes internally generated noise and increases the sensitivity and reliability of these subsystems. Signal processing and control is concentrated in base station 10, which preferably uses a laptop PC 130. That way if the standard, commercial laptop PC fails it can easily be replaced. Use of base station 10 with laptop PC 130 to control field probe 30 and oscillator driver 20 allows simple field procedures to be developed. Semi-skilled technicians, who do not need to fully understand TIMIS or the measurement and analysis in depth, can quickly perform the structure measurement. Furthermore, imbedding the TIMIS calibration data in base station 10 provides increased accuracy displayed in the field. Subsuming overall system control into laptop PC software 132 allows TIMIS to be adapted to a variety of secondary measurements, some using specialized sensors in place of skinny half-dipole 32, without modification of the primary system hardware. Further, subsuming overall system control into laptop PC software 132 allows the human interface to evolve, without hardware change, as field experience is gained with field technicians. Ancillary equipment for TIMIS includes: battery chargers, grounding stakes and conductors, equipment containers, and a field kit such as tools, etc.

TIMIS is distributed so that the source, the oscillator driver, of the drive signal, $I_d$, and of the synchronous timing signal, the sync signal, is isolated from the synchronous detection circuitry, or field probe, by noise immune communication channels (fiber optics) and isolated power sources (batteries). The analysis subsystem, the base station, is similarly isolated. This eliminates spurious interactions between the source circuitry and the detection circuitry.

The field probe packages the sensitive detection circuitry and its power source (battery) within the antenna in the fat half-dipole. This provides shielding of the sensitive detection circuitry from environmental noise, as well as an electromagnetically invariant antenna/detection system that can be calibrated and deployed independent of field conditions.

The fiber optic links eliminate potential spectral energy conduction paths to the inside of the structure and to the structure roof. This enhances explosives safety. Other wireless methods could be used. Battery power for all subsystems limits the spectral energy that the assembled system might, under fault conditions, inject into the structure.

The present embodiment of TIMIS as presented is optimized for explosives structures. This optimization includes certain features, some of which will not be necessary in the general application of TIMIS to measurements other than explosives shelters. These features include the $I_d$ phase approximation; the square-wave sync signal; the sync signal produced by oscillator driver 20; the fixed time constant for averager 76 of FIG. 5; the fixed gain of post-averager amplifier 78 of FIG. 5; the analog synchronous detection; and the various software features.

If TIMIS is used to measure impedances for which the reactive element of the total load on $I_d$ is not negligible, then the $I_d$ phase approximation is imprudent. Oscillator driver 20 can be augmented with a phase measurement circuit, such as that shown in FIG. 8, and base station 10 can use this phase information in calculating the transfer impedance phase, $\phi_{TI}$.

Figure 8:
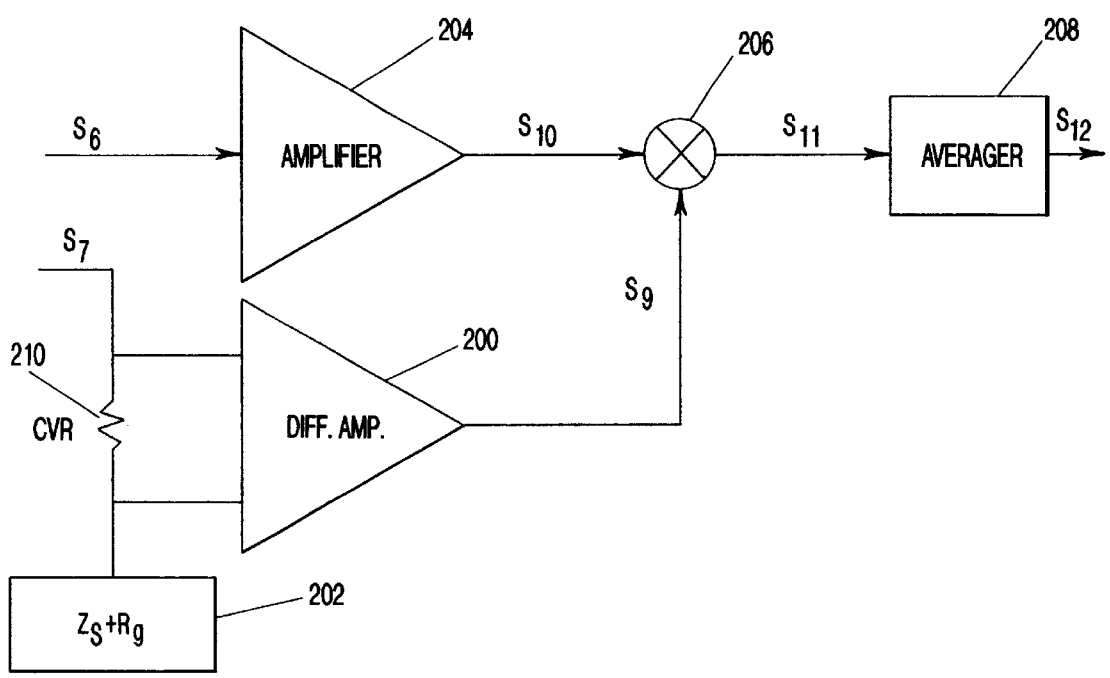
FIG. 8 is a circuit for measuring drive current phase relative to the sync signal.

A practical circuit, using electronic parts already successfully in use in TIMIS, for measuring the drive current phase, $\phi_d$, relative to the sync signal is illustrated in FIG. 8. Other phase measurement circuits are known and will be apparent to those skilled in the art. In the circuit illustrated in FIG. 8, the sinusoidal voltage drive signal $S_7$ (see FIG. 6 also) is applied to CVR 210 and load 202, as before. The voltage across the CVR is sensed by differential amplifier 200 and scaled to create the signal, $S_9$, which is in the operational range of multiplier 206. Likewise, the sinusoidal signal, $S_6$, which is synchronized to the sync signal, is scaled by amplifier 204 into the range of multiplier 206. The product, $S_{11}$, of the resulting signals, $S_9$ and $S_{10}$, is then averaged by averager 208 to produce $S_{12}$. This results in the following equations:

$$S_9 = A \sin(\omega t)$$

$$S_{10} = B \sin(\omega t + \phi_d)$$

$$S_{11} = S_9 S_{10} = \tfrac{1}{2} AB [\cos(2\omega t + \phi_d) + \cos(\phi_d)]$$

The average of $S_{11}$ is $S_{12} = \tfrac{1}{2} AB \cos(\phi_d)$. Thus, $\phi_d = -\arctan(2S_{12}/AB)$. This measurement of $\phi_d$ would be calibrated and then incorporated into the transfer impedance calculation. Thus, the transfer impedance phase would not be subject to the approximation: $\phi_d << \phi_{TT}$.

As discussed below, a sine-wave sync signal can be used rather than the square-wave sync of the present embodiment. The alternative embodiment with the sine-wave sync requires more extensive circuitry but provides slightly improved noise rejection.

The invention is not limited to the precise embodiments discussed above. The system can use either in-phase/quadrature algorithm or maximize the detected signal as a function of phase. It can use a square-wave or a sine-wave sync signal. Either analog or digital detection (after pre-amplification) can be used. The system can use either fixed detection gain and averaging time or variable detection gain and averaging time. Additionally, the inventive system can either assume negligible drive signal delay or can measure and compensate for this delay. The sync signal can originate at the oscillator driver or the base station. Furthermore, the system can make measurements other than transfer impedance by using sensors other than the dipole antenna and by injecting the output of these sensors directly into the detection circuitry with the skinny half-dipole removed.

In the present embodiment the sync signal is generated in the oscillator driver and its phase is shifted under control of the base station. This distribution of features is selected because the oscillator circuit can provide the in-phase and quadrature sync with little extra circuitry. The sync signal can also be generated by circuitry in the base station, and will be apparent to those skilled in the art.

Averager 76 of FIG. 5 consists of a "lossy" integrator such as a simple RC low pass filter and buffering operational amplifier. For simplicity, in the present embodiment this filter has a fixed time constant that is set for averaging the lowest measurement frequency. By using switched resisters the time constant can be reduced for higher frequencies; thus, measurement time can be reduced at higher frequencies. The trade-off is more complex circuitry and software.

Also for simplicity, in the present embodiment post-averager amplifier 78 of FIG. 5 has a fixed gain that is selected for the structures to be measured. As with the preamp gain, the post-averager gain can be variable, and the total field probe gain can be adaptively optimized for the impedance being measured. The trade-off is more complex circuitry and software.

For simplicity, in the present embodiment analog circuitry is used for multiplier 74, averager 76, and post-averager amplifier 78 of FIG. 5. These functions can instead be implemented with digital circuitry, that is, digital signal processing. A digital implementation provides more adaptive control features and requires more complex and higher power circuitry and more complex software.

In the present embodiment, the field probe antenna design is intended to produce a maximum drive voltage to the internal circuitry of the field probe that, in a uniform electric field, is accurately proportional to the magnitude of the electric field parallel to the antenna. The antenna responds negligibly to the electric field perpendicular to the axis of the antenna and responds negligibly to magnetic fields in any direction. Defining the radius and height of the skinny half-dipole to be $a_s$ and $h_s$, respectively, and the radius and height of the fat half-dipole to be $a_f$ and $h_f$, respectively, then the antenna responds, primarily, to the magnitude of the electric field parallel to the axis of the antenna if $h_f/a_f > 6$, $h_s/a_s > 6$, $k a_f << 1$, $k a_s << 1$, and if the antenna has radial symmetry about the axis. The quantity, $k = 2\pi/\lambda$, where $\lambda$ is the free space wavelength at the uniform electric field frequency. At the relatively low frequencies of this application, the input impedance of the antenna is capacitive. This antenna design produces a voltage source and an input impedance so that the input voltage to the field probe circuitry is maximized for a given antenna length and practical field probe volume.

To measure the properties of very poorly shielded structures, the sensitivity of the system can be reduced by reducing the length of the skinny half-dipole. A separate calibration is necessary for each length of the skinny half-dipole that is used.

The fat half-dipole can also be used to measure the normal electric field near a conducting ground plane by inverting the fat half-dipole and connecting the center conductor that would normally be connected to the skinny half-dipole instead to the conducting ground plane by a short wire. The fat half-dipole must be secured so that it is held above the ground plane and so that the axis of the fat half-dipole is perpendicular to the ground plane and the short wire should be no more than several inches in length. A separate calibration is necessary for this configuration. Alternatively, for ease of movement of antenna, the short wire from the fat half-dipole could be connected to a thin disc shaped connector lying on top of the ground plane.

Other radially symmetric antenna designs could be used, such as fat dipole antenna, with both halves of the antenna fat half-dipoles or a design consisting of a metal enclosed, center cylindrical volume that houses field probe electronics and power supply with thin monopole antennas symmetrically attached to both ends of the cylindrical volume and with the antenna feed connected to one of the monopoles.

Any other antenna design that responds only to a selected component of the electric field and yet has sufficient internal volume to house the field probe electronics and power supply would be suitable.

Base Station Software

Base station 10 functionality is almost entirely subsumed into software 132. As many information-processing features as practical are subsumed into base station software 132. This allows low-cost, future design enhancements. Base station software 132 is preferably written in Visual Basic and provides three principal measurement modes: calibration measurement, manual measurement, and automatic measurement.

The principal Graphical User Interfaces (GUIs) for these measurements are presented in FIGS. 10a–10f, 11a, and 11b. This overview only succinctly motivates a general understanding of the features and functions of base station software 132. A more complete discussion is presented below for the automatic measurement mode. The "top" GUI presented in FIG. 10a guides the user to select the measurement mode: calibration, manual, or automatic. Prior to transferring control to the desired measurement mode selected at the top GUI, shown in FIG. 10a, a test is performed of the communication links and the antenna is shorted and $I_d$ is set to zero. The "View Communications" window shown in FIG. 10f can supplement any measurement mode.

Figure 10A:
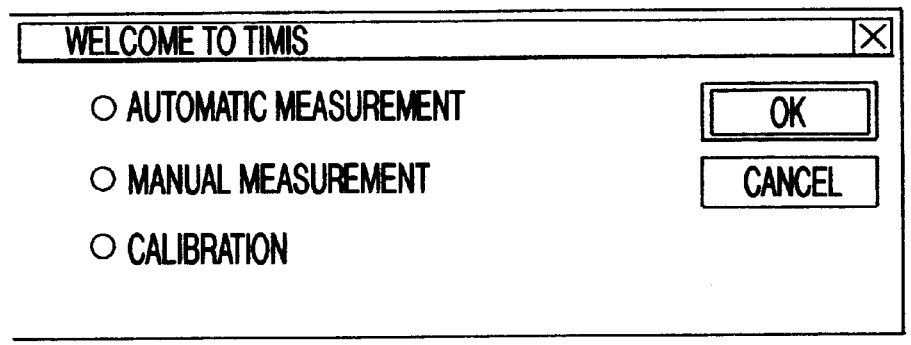
FIG. 10a shows the graphical user interface that guides the user to select a measurement mode.
Figure 10B:
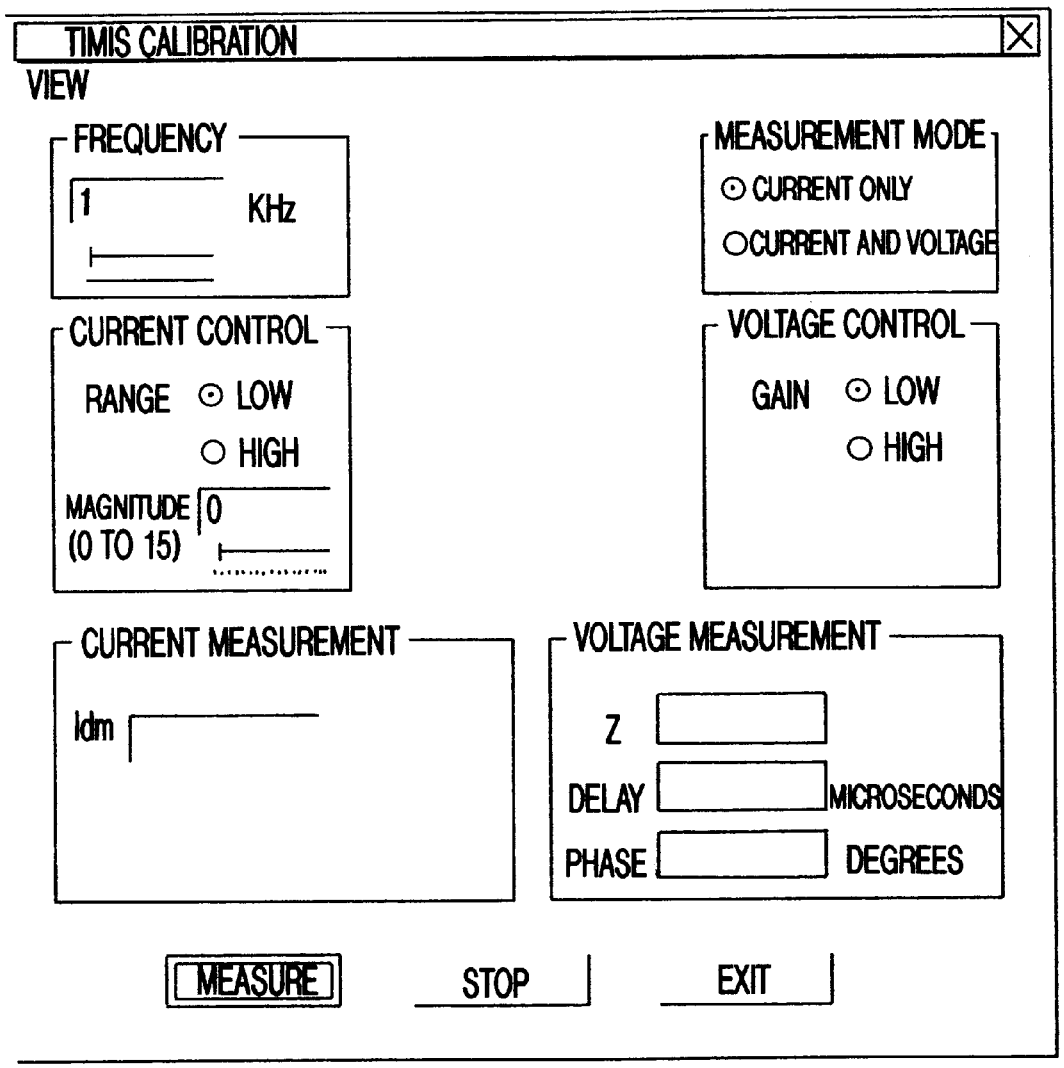
FIG. 10b shows the graphical user interface for the calibration mode.

The simplest of the measurements is the calibration measurement. FIG. 10b presents the GUI for the calibration mode. The concerted calibration process includes 1) operating TIMIS in the calibration measurement mode, 2) post measurement processing, and 3) entry of calibration parameters into tables, such as Excel tables. Table 1 is an example of a calibration parameters table. At the calibration measurement GUI the user specifies 1) frequency, 2) drive voltage, 3) current range, and 4) preamp gain. For these settings TIMIS measures and displays the uncalibrated values for $I_{dm}$ and for the amplitude, phase, and delay of $V_{ef}$. In accordance with a prescribed calibration procedure, measurements are taken over the frequency set used for automatic measurement at representative settings for drive voltage and at all settings for current range and preamp gain. These measurements result in the calibration tables that software 132 uses in the manual and automatic measurement modes.

TABLE 1

TIMIS Calibration Parameters

| Index | Frequency | Transfer to intF(25) (intGain = 0) | Transfer to sngCp (2,25) $C_p$ (intGain = 0) | Transfer to sngCp (2,25) $C_p$ (intGain = 1) | Transfer to sngCdelay (2,25) $C_{delay}$ (intGain = 0) | Transfer to sngCdelay (2,25) $C_{delay}$ (intGain = 1) |
|---|---|---|---|---|---|---|
| 0 | 5 | | 0.03990 | 0.00407 | −4.880 | −6.650 |
| 1 | 15 | | 0.03990 | 0.00410 | −0.170 | −0.570 |
| 2 | 50 | | 0.04190 | 0.00436 | 0.160 | 0.050 |
| 3 | 100 | | 0.05330 | 0.00599 | 0.137 | 0.000 |
| 4 | 150 | | 0.05210 | 0.00570 | −0.627 | −0.710 |
| 5 | 200 | | 0.03470 | 0.00299 | −0.356 | −0.450 |
| 6 | 300 | | 0.02980 | 0.00263 | −0.144 | −0.200 |
| 7 | 450 | | 0.02780 | 0.00245 | −0.057 | −0.106 |
| 8 | 675 | | 0.02460 | 0.00229 | −0.036 | −0.057 |
| 9 | 950 | | 0.02710 | 0.00265 | −0.018 | 0.000 |
| 10 | | | | | | |
| 11 | | | | | | |
| 12 | | | | | | |
| 13 | | | | | | |
| 14 | | | | | | |
| 15 | | | | | | |
| 16 | | | | | | |
| 17 | | | | | | |
| 18 | | | | | | |
| 19 | | | | | | |
| 20 | | | | | | |
| 21 | | | | | | |
| 22 | | | | | | |
| 23 | | | | | | |
| 24 | | | | | | |

| Transfer to sngCd(2) | |
|---|---|
| IR | $C_d$ |
| 0 | 0.1776 |
| 1 | 1.182 |

Units and type:
Frequency - kHz, integer 1 to 1000
$C_p$ - (microvolts/m)/count, single
$C_{delay}$ - microseconds/count, single
$C_d$ - milliAmps/count, single
Rules:
Frequencies (values 1–1000) increase, minimum of 2 frequencies, maximum of 25
Zeros after last entry frequency entry
Cp, Cdelay entries for every frequency entry, entry can be zero The calibration mode allows the user full control of required settings for both the field probe (antenna and gain) and the oscillator driver (frequency, current range and magnitude). The program allows the user to calibrate $I_d$ from $I_{dm}$ using the oscillator driver only, or it allows the user to calibrate $V_{ef}$ from z and delay using the field probe in concert with the oscillator driver. Clicking "Measure" initiates a continuous measurement loop for making the above measurements. Each measurement of $I_{dm}$ takes about 200 milliseconds. Each measurement of $I_{dm}$, z, and delay takes about 2.5 seconds. Clicking "Stop" exits the measurement loop and allows system interconnections to be changed without causing communication error messages.

FIG. 10c shows the GUI for the manual measurement mode. The manual measurement is similar to the calibration measurement in that the user has full control of the measurement frequency and settings. It has three significant differences: 1) the measurements are adjusted for calibration before display, 2) the transfer impedance is calculated, and 3) frequency is preferably 1 kHz to 1,000 kHz in steps of preferably 1 kHz. The adjustment for calibration is achieved by using the tables for automatic measurement and extrapolating between frequency values in the automatic measurement frequency set. The displayed measurements are drive current magnitude, $V_{ef}$ magnitude, and transfer impedance magnitude and phase.

As with calibration, the manual measurement allows the user full control of required settings for both the field probe (antenna and gain) and the oscillator driver (frequency, current range and magnitude). The manual measurement differs in that warnings are issued if the measurement produces an out-of-bounds reading, but the user may ignore the warning and accept the measurement. The "uncalibrated" (raw) measurements from the field probe and oscillator driver are adjusted to calibrated measurements using the calibration tables for the automatic measurement. Since these calibration tables are for the specified frequency set for automatic measurement, linear interpolation is used for frequencies not in this set. Clicking "Measure" initiates a continuous measurement loop and calibration of each measurement for the illustrated measurements. Each measurement of $I_d$, $A_p$, and transfer impedance takes about 2.5 seconds. Clicking "Stop" exits the measurement loop and allows system interconnections to be changed without causing communication error messages.

FIGS. 10d and 10e show GUIs for the automatic measurement mode. Automatic measurement is similar to manual measurement with four significant differences: 1) measurements are made over a predetermined frequency set Preferably (2 to 25 values, typically about 10), 2) the measurements are recorded in tables, such as Excel tables, as are settings and other significant data, 3) the transfer impedance magnitude and gain are plotted, and 4) this process of measurement, recording, and display is automatically controlled by the software. The user specifies file names for data storage and then initiates the automatic measurement process.

The real-time communications between the base station and the oscillator driver, and between the base station and the field probe are continuously displayed on the GUI shown in FIG. 10f. This GUI is displayed concurrently with the GUI for the measurement mode, automatic, manual, or calibration. The communication messages are displayed as a string of bytes in decimal. This window can be minimized or closed during measurement, and it may be opened from any measurement window.

As a general overview, the automatic measurement software manages the following procedure for a single frequency measurement:
1. Oscillator 96 is set to one of the predetermined frequencies.
2. A minimum $I_d$ test and a noise measurement are performed.
3. $I_d$ amplitude is adjusted while observing x and y, the interim electric field measurements.
4. If field probe 30 can be brought to a mid-range detection measurement for the higher reading for either x or y, then the measurement is recorded and processed (as discussed below).
5. If field probe 30 measurement is out of mid-range for both x and y, then the current $I_d$, preamp gain, and/or the current range are adjusted until either the x or y are within mid-range. The measurement is recorded and processed.
6. $I_d$ is reduced to half amplitude and the measurement is retaken to verify linear operation.
7. Key in-process information is displayed to the field technician as the measurement is being made.

If the measurement cannot be adjusted to the desired mid-range then in most cases the measurement is made anyway, but an "exception" is recorded and a warning is issued at the messages portion of the GUI shown in FIG. 10e. Exceptions are recorded for the following: $V_{ef}$ too low, $V_{ef}$ too high, nonlinear, and high noise. The recording of an exception does not mean the measurement is bad, but the exception suggests that the data associated with that measurement be examined and that perhaps the measurement be retaken. The accuracy estimates only apply to measurements that incur no exceptions. This procedure increases the system sensitivity and accuracy while preserving the linear operation of TIMIS. The procedure also reduces the influence of noise on the measurement by increasing the $V_{ef}$ and $I_d$ to their highest practical levels. Key parameters for controlling this processing are stored in an Excel table, such as shown in Table 2. This allows the user to change the parameters without changing the program.

TABLE 2

TIMIS Control Parameters

| | | |
|---|---|---|
| 1 | gsngXYmax | 4000 |
| 2 | gsngXYhigh | 3500 |
| 3 | gsngXYlow | 1500 |
| 4 | gsngXYmin | 50 |
| 5 | gsngNoiseFactor | 150 |
| 6 | gsngZRmax | 1.5 |
| 7 | gsngZRmin | 0.5 |
| 8 | gsngImin | 25 |
| 9 | gsngVod1 | 0.849 |
| 10 | gsngVod2 | 1.4 |
| 11 | gsngTratio | 0.05 |
| 12 | gintDelayCommFP | 3.00E+04 |
| 13 | gintDelayCommOD | 3.00E+04 |
| 14 | gbytDelayFP1 | 80 |
| 15 | gbytDelayFP2 | 40 |

Units:
gsngXYmin, gsngXYhigh, gsngXYlow, gsngXYmin - unitless, 0–4095
gsngNoiseFactor, gsngZRmax, gsngZRmin - unitless
gsngImin- unitless, 0–255
gsngVod1, gsngVod2 - volts RMS
gsngTratio - unitless
gintDelayCommFP, gintDelayOD - seconds
gbytDelayFP1, gbytDelayFP2 - unitless, 0–255 (2 seconds/255)

This procedure is repeated for the selected test frequencies (preferably approximately ten frequencies) preferably from 1 kHz to 1,000 kHz, beginning at the lowest frequency and progressing to the highest frequency. The resulting transfer impedance function is adjusted with the calibration data and is displayed. See FIGS. 11a and 11b.

The automatic measurement mode is intended to be the most commonly used measurement mode of the TIMIS. The GUIs guide the user to define the folder/file names for storing measurement data, which is automatically taken at a specific location/site/position. The transfer impedance is plotted at the end of each measurement (FIGS. 11a and 11b), and interim messages are displayed during the measurement. An automatic measurement takes approximately 2.5 minutes.

The process for the automatic measurement is rather complex and is illustrated in the software flow diagrams. The program consists of the following sections:

A1.0 Input

Location folder—GUI, "TIMIS Automatic Measurement—Path Information"

Site folder—GUI, "TIMIS Automatic Measurement—Path Information"

Test Position file—GUI, "TIMIS Automatic Measurement"

A2.0 Data Acquisition Section—GUI, "TIMIS Automatic Measurement"

Determine offsets

Measure (uncalibrated)

Test for linearity

A3.0 Analysis and Output Section—GUI, "TIMIS Automatic Measurement"

Adjust for calibration

Transfer data to Excel tables (See Tables 3a, 3b, and 3c below) and plot transfer impedance The two more complicated subsections—"Measure" and "Test for linearity"—are illustrated in detailed flow diagrams shown in FIGS. 14a–14f and 15.

TABLE 3a

Primary Measurement Table

| Index | Freq. | Id mA | Ap microV | TI mOhms | Phase degrees | Noise microV | Exceptions 0 | 1 | 2 | 3 | 4 |
|---|---|---|---|---|---|---|---|---|---|---|---|
| 0 | 5 | 153.66 | 63.4301 | 0.41279 | −0.4653 | 0 | 0 | 0 | 0 | 0 | 0 |
| 1 | 15 | 154.842 | 63.243 | 0.40844 | −0.5204 | 0.11284 | 0 | 0 | 0 | 0 | 0 |
| 2 | 50 | 154.842 | 63.2855 | 0.40871 | −0.3461 | 0.17774 | 0 | 0 | 0 | 0 | 0 |
| 3 | 100 | 30.732 | 10.2408 | 0.33323 | 2.51429 | 0 | 0 | 0 | 0 | 0 | 0 |
| 4 | 150 | 39.006 | 13.4543 | 0.34493 | 3.19064 | 0 | 0 | 0 | 0 | 0 | 0 |
| 5 | 200 | 39.006 | 11.2602 | 0.28868 | 1.71195 | 0.23676 | 0 | 0 | 0 | 0 | 0 |
| 6 | 300 | 31.914 | 9.06223 | 0.28396 | 3.70815 | 0.20454 | 0 | 0 | 0 | 0 | 0 |
| 7 | 450 | 19.7136 | 6.859 | 0.34793 | −3.0514 | 0.40186 | 1 | 0 | 0 | 0 | 0 |
| 8 | 675 | 19.7136 | 7.31266 | 0.37094 | −3.368 | 0.24933 | 0 | 0 | 0 | 0 | 0 |
| 9 | 950 | 19.7136 | 7.59924 | 0.38548 | −3.2585 | 0.26979 | 0 | 0 | 0 | 0 | 0 |
| 10 | 0 | 0 | 0 | 0 | 0 | 0 | 0 | 0 | 0 | 0 | 0 |
| 11 | 0 | 0 | 0 | 0 | 0 | 0 | 0 | 0 | 0 | 0 | 0 |
| 12 | 0 | 0 | 0 | 0 | 0 | 0 | 0 | 0 | 0 | 0 | 0 |
| 13 | 0 | 0 | 0 | 0 | 0 | 0 | 0 | 0 | 0 | 0 | 0 |
| 14 | 0 | 0 | 0 | 0 | 0 | 0 | 0 | 0 | 0 | 0 | 0 |
| 15 | 0 | 0 | 0 | 0 | 0 | 0 | 0 | 0 | 0 | 0 | 0 |
| 16 | 0 | 0 | 0 | 0 | 0 | 0 | 0 | 0 | 0 | 0 | 0 |
| 17 | 0 | 0 | 0 | 0 | 0 | 0 | 0 | 0 | 0 | 0 | 0 |
| 18 | 0 | 0 | 0 | 0 | 0 | 0 | 0 | 0 | 0 | 0 | 0 |
| 19 | 0 | 0 | 0 | 0 | 0 | 0 | 0 | 0 | 0 | 0 | 0 |
| 20 | 0 | 0 | 0 | 0 | 0 | 0 | 0 | 0 | 0 | 0 | 0 |
| 21 | 0 | 0 | 0 | 0 | 0 | 0 | 0 | 0 | 0 | 0 | 0 |
| 22 | 0 | 0 | 0 | 0 | 0 | 0 | 0 | 0 | 0 | 0 | 0 |
| 23 | 0 | 0 | 0 | 0 | 0 | 0 | 0 | 0 | 0 | 0 | 0 |
| 24 | 0 | 0 | 0 | 0 | 0 | 0 | 0 | 0 | 0 | 0 | 0 |

Ceiling Height (m): 1

TABLE 3b

Secondary Measurement Table

| Index | Freq. kHz | Icmd 0–15 | IR 0,1 | Vod Volts RMS | Idm 0–255 | Gain 0,1 |
|---|---|---|---|---|---|---|
| 0 | 5 | 15 | 1 | 14.135 | 130 | 0 |
| 1 | 15 | 15 | 1 | 14.135 | 131 | 0 |
| 2 | 50 | 15 | 1 | 14.135 | 131 | 0 |
| 3 | 100 | 1 | 1 | 2.249 | 26 | 1 |
| 4 | 150 | 2 | 1 | 3.098 | 33 | 1 |
| 5 | 200 | 2 | 1 | 3.098 | 33 | 1 |
| 6 | 300 | 1 | 1 | 2.249 | 27 | 1 |
| 7 | 450 | 7 | 0 | 7.343 | 111 | 1 |
| 8 | 675 | 7 | 0 | 7.343 | 111 | 1 |
| 9 | 950 | 7 | 0 | 7.343 | 111 | 1 |
| 10 | 0 | 0 | 0 | 0 | 0 | 0 |
| 11 | 0 | 0 | 0 | 0 | 0 | 0 |
| 12 | 0 | 0 | 0 | 0 | 0 | 0 |
| 13 | 0 | 0 | 0 | 0 | 0 | 0 |
| 14 | 0 | 0 | 0 | 0 | 0 | 0 |
| 15 | 0 | 0 | 0 | 0 | 0 | 0 |
| 16 | 0 | 0 | 0 | 0 | 0 | 0 |
| 17 | 0 | 0 | 0 | 0 | 0 | 0 |
| 18 | 0 | 0 | 0 | 0 | 0 | 0 |
| 19 | 0 | 0 | 0 | 0 | 0 | 0 |
| 20 | 0 | 0 | 0 | 0 | 0 | 0 |
| 21 | 0 | 0 | 0 | 0 | 0 | 0 |
| 22 | 0 | 0 | 0 | 0 | 0 | 0 |
| 23 | 0 | 0 | 0 | 0 | 0 | 0 |
| 24 | 0 | 0 | 0 | 0 | 0 | 0 |

TABLE 3c

Secondary Measurement Table (cont.)

| Index | X 0-4095 | Xoffset 0-4095 | Y 0-4095 | Yoffset 0-4095 | Z 0-5790 | Load Ohms | Adjust. 0-50 |
|---|---|---|---|---|---|---|---|
| 0 | 1573 | 0 | −230 | 0 | 1589.73 | 91.9888 | 0 |
| 1 | 1585 | 0 | −11 | 0 | 1585.04 | 91.2866 | 0 |
| 2 | 1508 | 0 | 85 | 0 | 1510.39 | 91.2866 | 0 |
| 3 | 1708 | 0 | −75 | 0 | 1709.65 | 73.1811 | 1 |
| 4 | 1767 | 0 | −1565 | 0 | 2360.41 | 79.4237 | 1 |
| 5 | 3118 | 0 | −2112 | 0 | 3765.96 | 79.4237 | 0 |
| 6 | 3115 | 0 | −1473 | 0 | 3445.72 | 70.4706 | 1 |
| 7 | 2715 | 0 | −683 | 0 | 299.59 | 372.484 | 9 |
| 8 | 3140 | 0 | −581 | 0 | 3193.3 | 372.484 | 0 |
| 9 | 2863 | 0 | 163 | 0 | 2867.64 | 372.484 | 0 |
| 10 | 0 | 0 | 0 | 0 | 0 | 0 | 0 |
| 11 | 0 | 0 | 0 | 0 | 0 | 0 | 0 |
| 12 | 0 | 0 | 0 | 0 | 0 | 0 | 0 |
| 13 | 0 | 0 | 0 | 0 | 0 | 0 | 0 |
| 14 | 0 | 0 | 0 | 0 | 0 | 0 | 0 |
| 15 | 0 | 0 | 0 | 0 | 0 | 0 | 0 |
| 16 | 0 | 0 | 0 | 0 | 0 | 0 | 0 |
| 17 | 0 | 0 | 0 | 0 | 0 | 0 | 0 |
| 18 | 0 | 0 | 0 | 0 | 0 | 0 | 0 |
| 19 | 0 | 0 | 0 | 0 | 0 | 0 | 0 |
| 20 | 0 | 0 | 0 | 0 | 0 | 0 | 0 |
| 21 | 0 | 0 | 0 | 0 | 0 | 0 | 0 |
| 22 | 0 | 0 | 0 | 0 | 0 | 0 | 0 |
| 23 | 0 | 0 | 0 | 0 | 0 | 0 | 0 |
| 24 | 0 | 0 | 0 | 0 | 0 | 0 | 0 |

Tables 1, 3a, 3b and 3c show ten measurements, however 25 or more can be taken. After entering the required information at the GUIs the user initiates the measurement by clicking "Begin Test." After a measurement at a particular test position, the user may save the measurement tables, close Excel, and initiate a new measurement at a new position. The user may also navigate through the Excel tables and review the stored data.

The TIMIS software is preferably written in Visual Basic (VB) and resides in the base station laptop PC. This software can evolve as field experience is gained. Indeed, TIMIS is designed to accommodate most expected evolution with changes to the VB software rather than the hardware and firmware. Thus, the general attributes and interrelations of the software are discussed. Discussion of the GUIs is necessary to present the general software attributes, however, these GUIs are expected to evolve so the GUIs herein are to be considered as representative but not exact.

Organization of the Software

Figure 12:
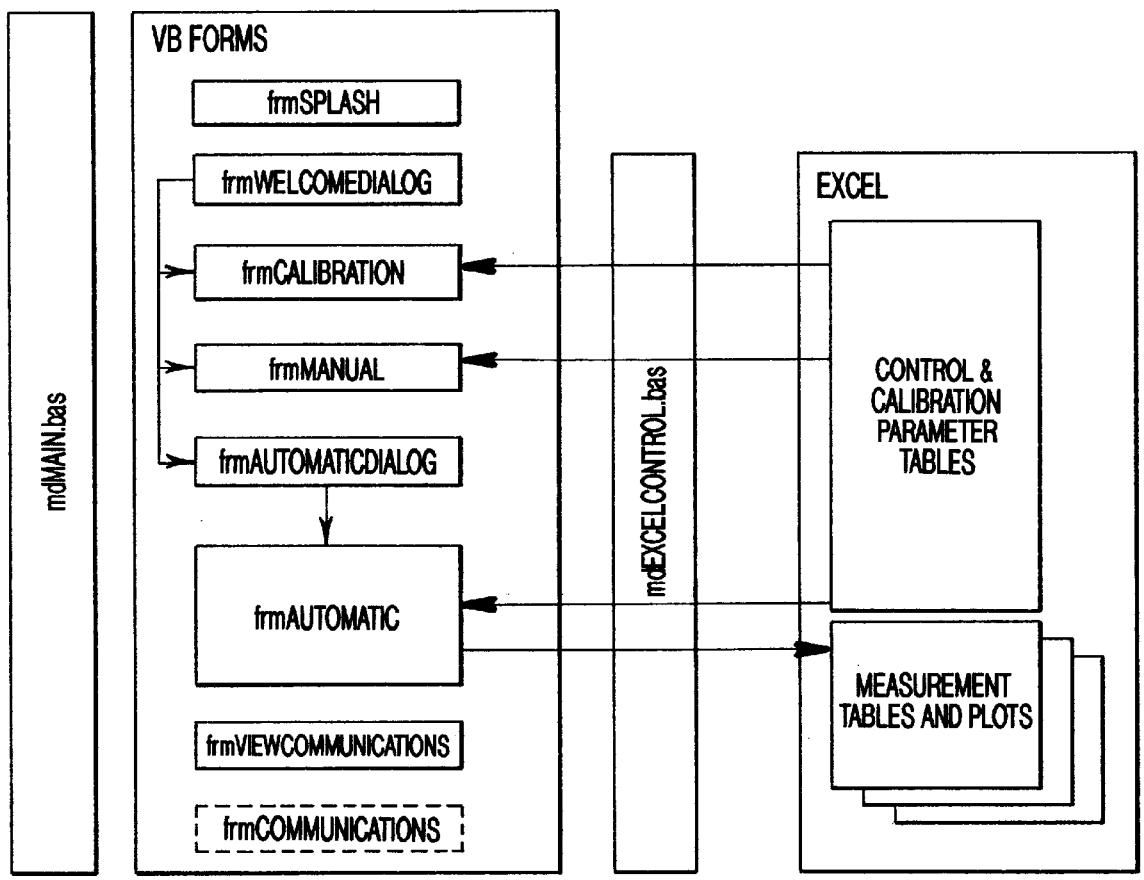
FIG. 12 is an overview of the software organization for the apparatus according to the present invention.
Figure 13A:
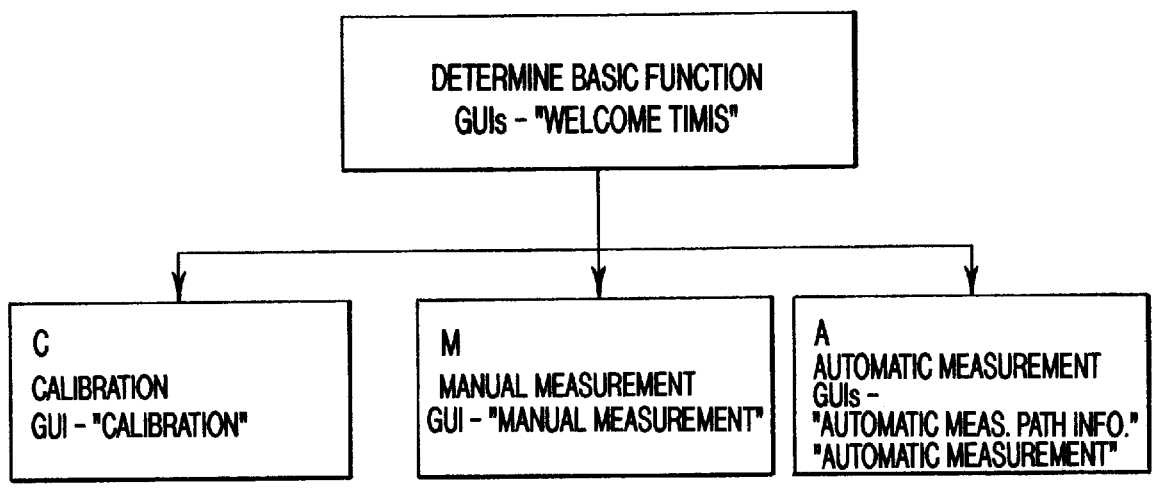
FIG. 13a is the initial software flow diagram wherein the user chooses the measurement mode for the apparatus according to the present invention.
Figure 13B:
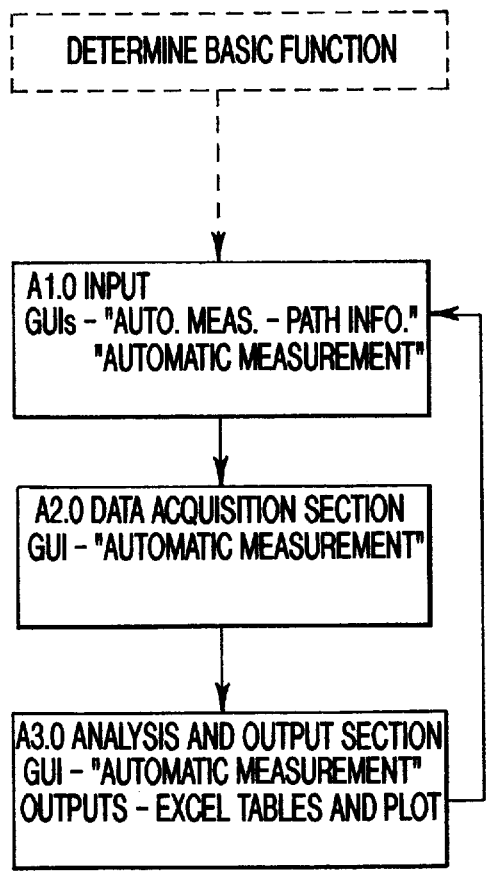
FIG. 13b is the automatic operation mode software flow diagram for the apparatus according to the present invention.
Figure 13C:
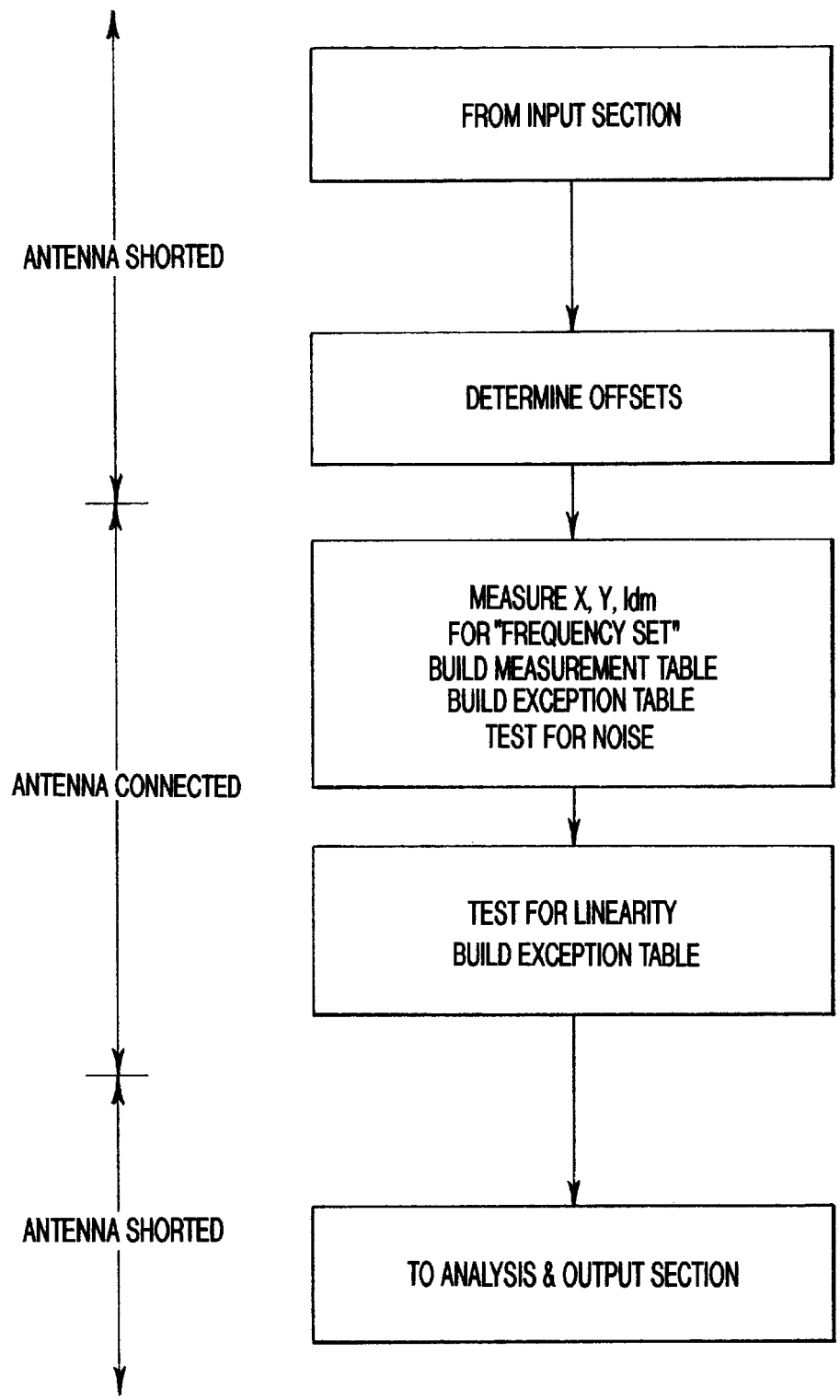
FIG. 13c is the data acquisition software flow diagram for the apparatus according to the present invention.
Figure 13D:
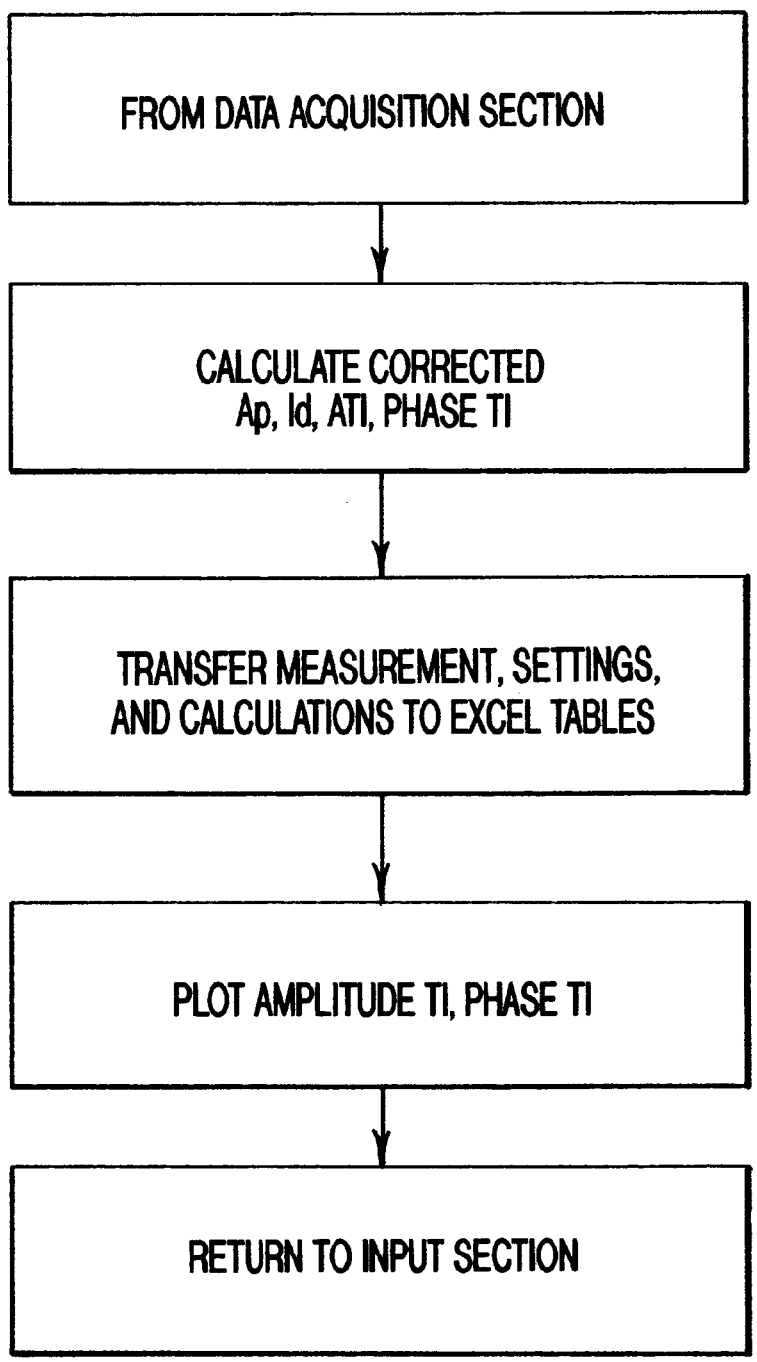
FIG. 13d is the analysis and output software flow diagram for the apparatus according to the present invention.

The software is organized as illustrated in FIG. 12. The primary modules and forms of the VB code are illustrated on the left. The measurement modules operate in concert with, preferably, Excel, illustrated on the right. The VB modules and forms consist of the following:

VB Modules mdlMain.bas—Main driver function that controls program flow and interaction between forms mdlExcelControl.bas—Function that passes information between VB programs and Excel tables VB Forms frmSplash—Splash form for TIMIS and BOLT frmWelcomeDialog—"Welcome to TIMIS" GUI and measurement mode selection frmCalibration—"Calibration" GUI and calibration code frmManual—"TIMIS Manual Measurement" GUI and manual measurement code frmAutomaticDialog—"TIMIS Automatic Measurement Path Information" GUI and code frmAutomatic—"TIMIS Automatic Measurement" GUI and automatic measurement code frmViewCommunications—"View Communications" GUI and view communications code frmCommunications—Hidden form used as a container for public and private communications and comm port control As seen, the Excel tables consist of control and calibration tables and measurement tables. The control and calibration tables provide information for all three measurement modes. The automatic measurement program stores its results in the measurement tables.

The VB modules interact with all or many VB forms and their programs. In concert, they control program flow, provide common functions and information, and control the flow of information between forms or programs. The information below details the functions they provide:

mdlMain.bas

Main driver function that controls program flow and interaction between forms byte_to_int int_to_byte global variables mdlExcelControl.bas Function that passes information between VB programs and Excel tables The set of software flow diagrams shown in FIGS. 13a–13d, 14a–14f, and 15 supplements the source code for the Visual Basic program in the base station, which controls, processes, stores, and displays the TIMIS measurement information. These flow diagrams provide a graphical view of the relationships among the high-level code sections and illustrate the more complex subsections. Simpler subsections are not illustrated. The dotted arrows in these flow diagrams indicate object oriented flow, which may not be sequential. Dotted boxes are used to indicate flow to and from previously illustrated sections. The sections have an obvious numbering scheme.

Figure 14A:
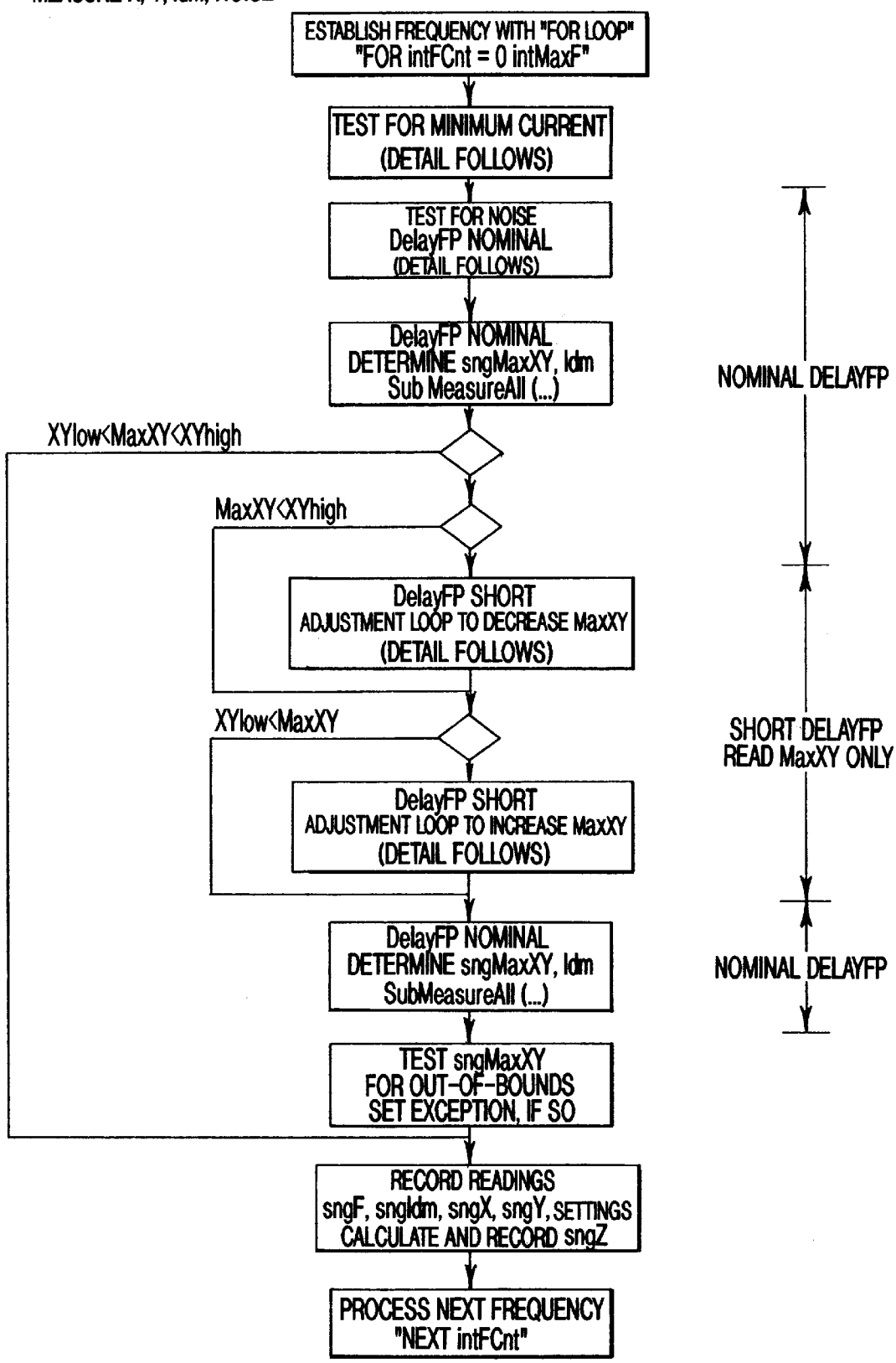
FIG. 14a is a subsection of FIG. 13c showing the measure X, Y, $I/_{dm}$ and noise software flow diagram for the apparatus according to the present invention.
Figure 14B:
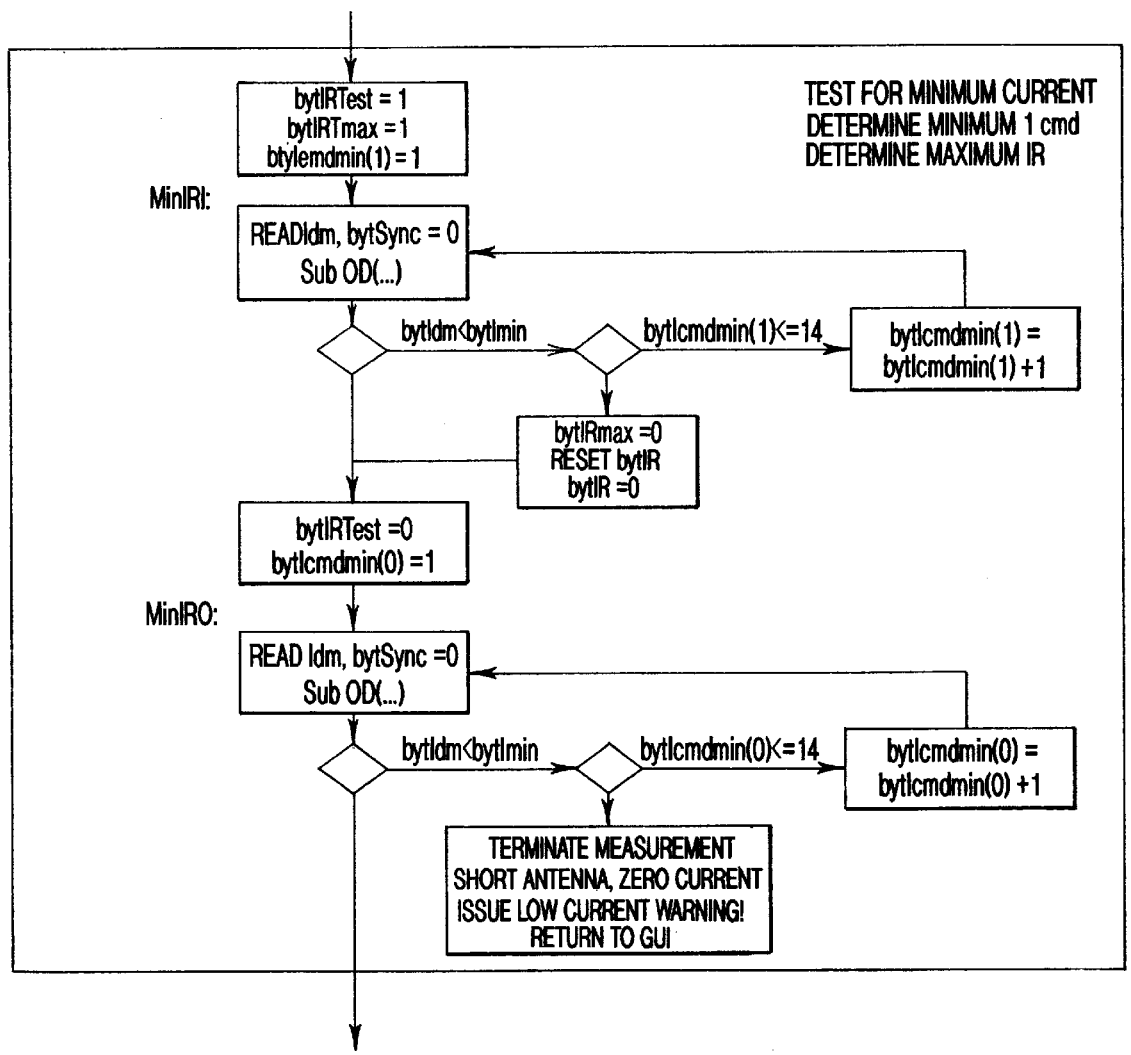
Figure 14C:
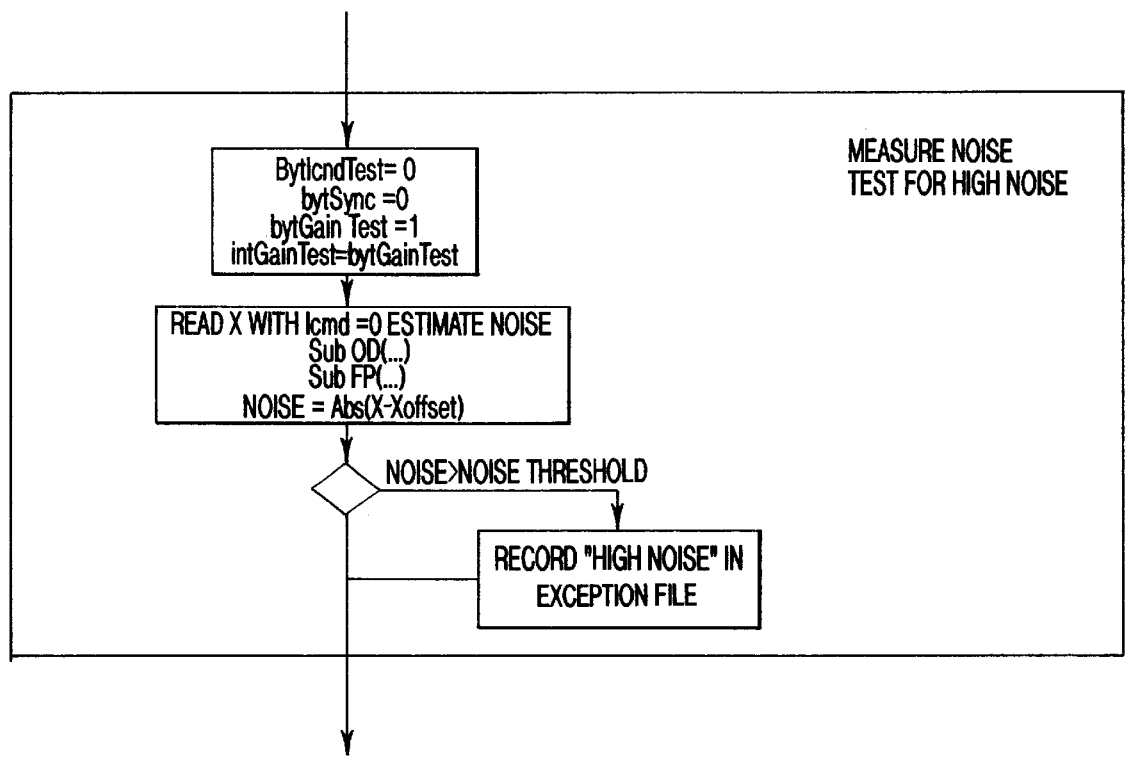
FIG. 14c is a continuation of the software flow diagram of FIG. 14b.
Figure 14D:
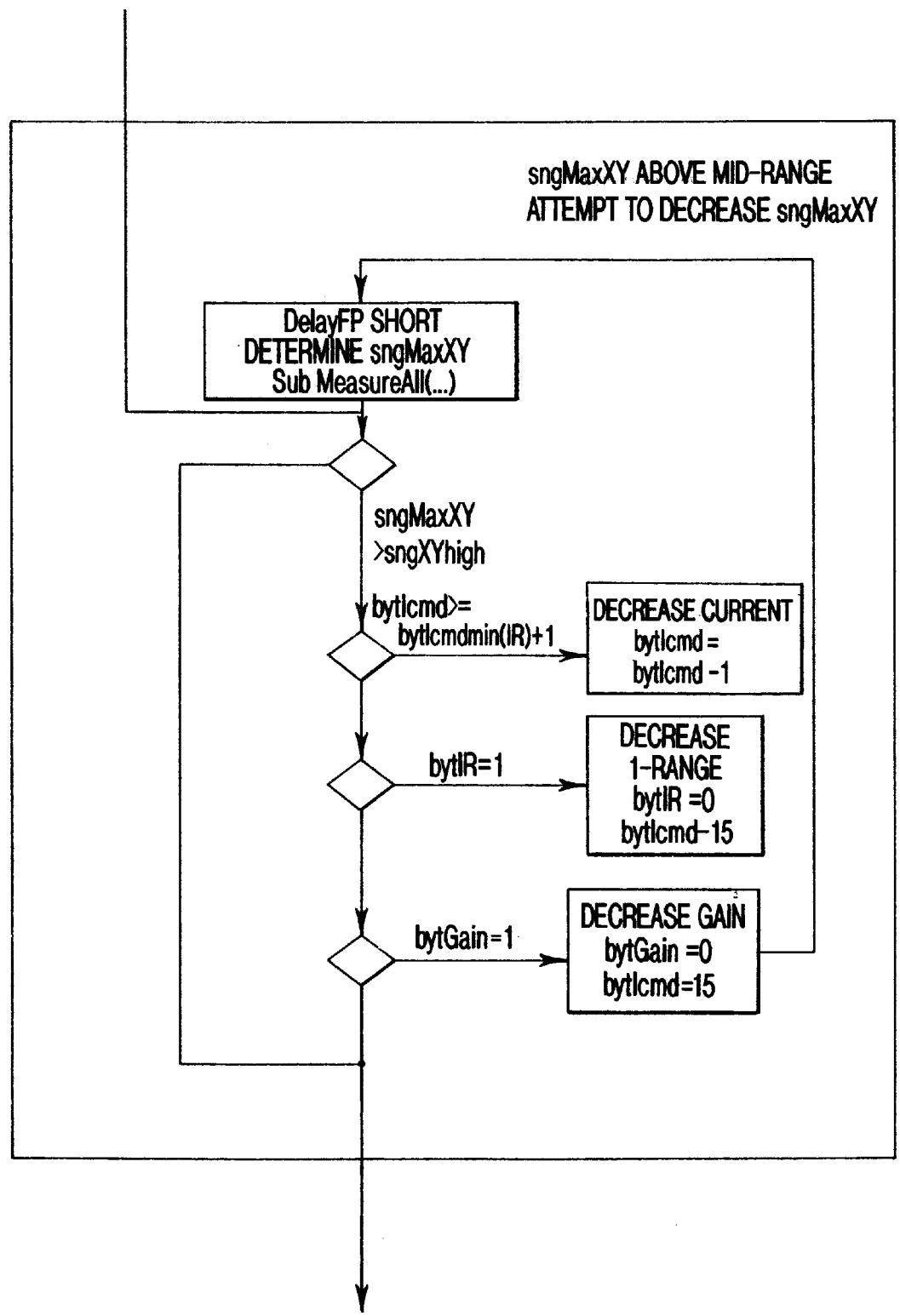
FIG. 14d is a continuation of the software flow diagram of FIG. 14c.
Figure 14E:
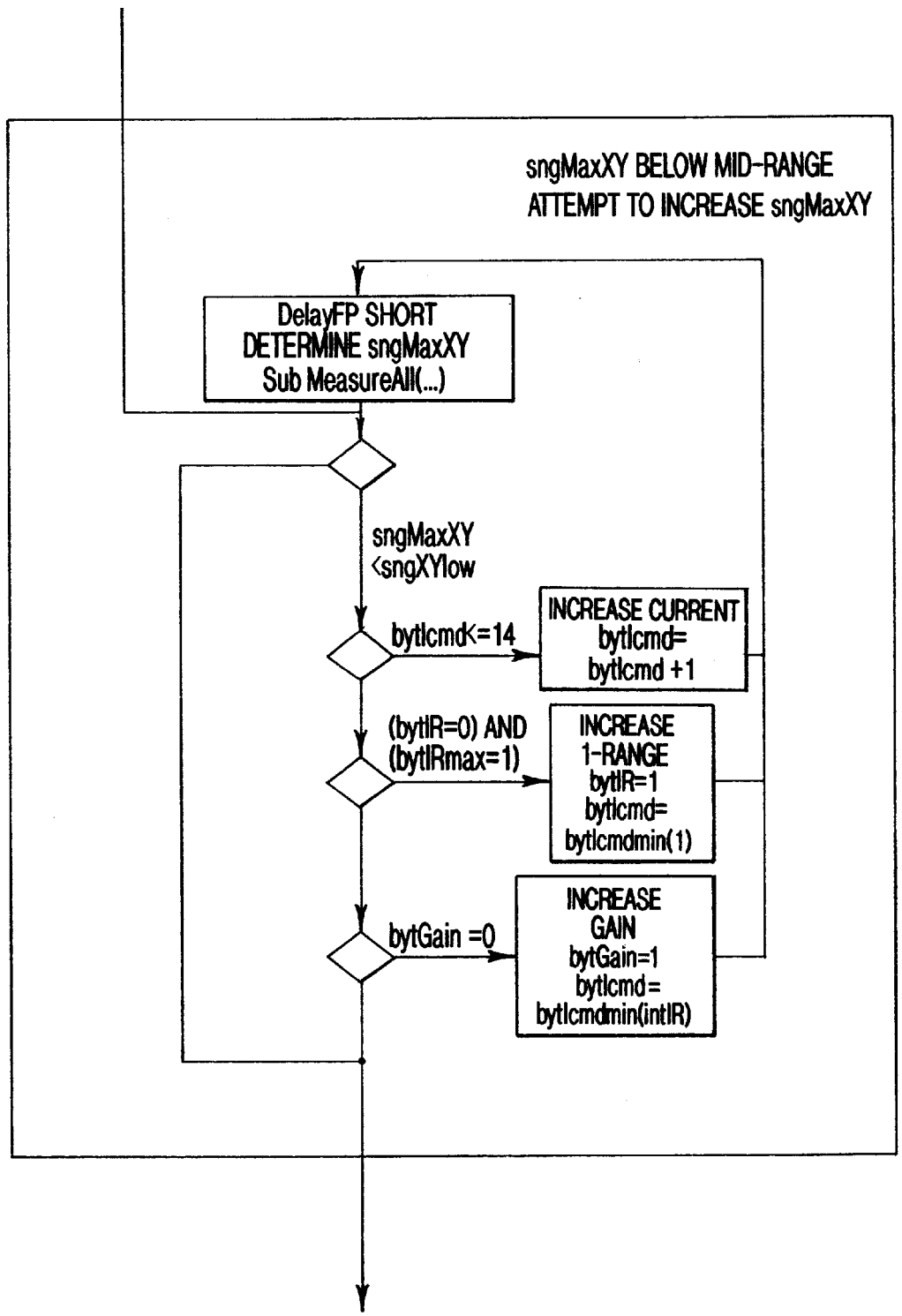
FIG. 14e is a continuation of the software flow diagram of FIG. 14d.
Figure 14F:
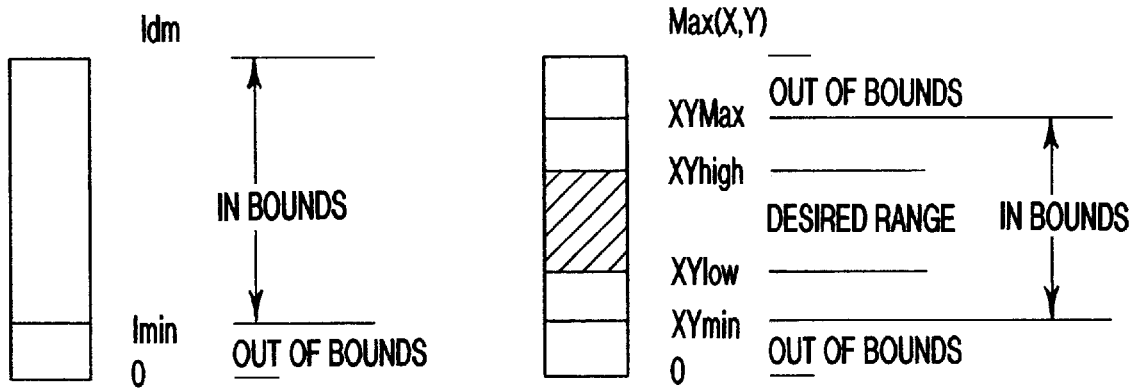
FIG. 14f demonstrates the determination of whether X, Y and $I/_{dm}$ are in or out of bounds.

It should be noted on FIGS. 14a–14e that the algorithm seeks to adjust the current and gain so that Max (X,Y) is between sngXYhigh and sngXYlow; that is, the algorithm seeks to take readings in "mid-range" (See FIG. 14f). Failing this, the algorithm tests to see if Max(X,Y) is within design bounds. If the measurement bounds are exceeded a record is made in the Exception file and the measurement process continues. In the case of out-of-bounds current ($I_{dm}<I_{min}$), a real time warning is issued and processing is terminated. The initial conditions are to set gain=0, $I_{dm}$ high-value for high range, and frequency to lowest frequency.

To Test Current and Noise

1) Test current (FIG. 14b)

The minimum value for Icmd to ensure $I_{dm}$>Imin is determined for each current range. If the drive current measurement, $I_{dm}$, cannot be adjusted above Imin, then processing is terminated and a warning is given. An Idm below Imin probably indicates 1) a poor connection of the oscillator driver to the roof or earth, 2) a very high earth resistance, or 3) a very high structure resistance.

2) Test noise (FIG. 14c)

The drive current is commanded to zero and the X offset is measured at high gain with the antenna connected. This measurement is compared to sgnNoiseFactor times the X offset previously measured with the antenna shorted. If this threshold is exceeded, a "high noise" exception is recorded.

Adjustment for Measurement

Readings are made for sngMaxXY, the maximum of the magnitudes of X or Y, and sngIdm at nominal DelayFP. If SngMaxXY is in mid-range the readings are recorded. A delay of about 1–2 seconds is required when reading X or Y to allow the averager circuit to reach steady state.

If above mid-range (FIG. 14d), read MaxXY at short DelayFP. SngMaxXY is tested for >sngXYhigh. If this dc voltage,sngMaxXY, is high an attempt is made to lower the voltage by decreasing the current if possible, and if not possible by decreasing the gain. If either of these measures is permitted new readings are taken, and the algorithm "loops." If sngMaxXY cannot be reduced below sgnXYhigh, then the readings are retaken at nominal DelayFP and recorded. If sngMaxXY is greater than XYmax it probably indicates a very poor structure. The TIMIS has inadequate range to measure this structure at this measurement point (system gain cannot be lowered enough). The maximum iterations in this loop is 48 (about 75 seconds).

If below mid-range (FIG. 14e), read MaxXY at short Delay FP. The maximum of X or Y is tested for <sngXYlow. If this dc voltage, sngMaxXY, is low an attempt is made to raise the voltage by increasing the current if possible, and if not possible by increasing the gain. If either of these measures is permitted new readings are taken, and the algorithm "loops." If sngMaxXY cannot be increased above sngXYlow, then the readings are retaken at nominal DelayFP and recorded. If sngMaxXY is less than XYmin it probably indicates a very good structure. The TIMIS has inadequate sensitivity to measure this structure at this measurement point (system gain cannot be raised enough). The maximum iterations in this loop is 48 (about 75 seconds).

If either adjustment loop was executed, then retake the measurements at nominal DelayFP and test for out-of-bounds MaxXY.

If sngMaxXY is in mid-range, then the algorithm has adjusted the readings to the desired levels. The readings are re-taken at nominal DelayFP. If sngMaxXY is out-of-bounds, exceptions are recorded. The readings and settings are recorded. Z is calculated and recorded.

The frequency is increased until the measurements over the frequency set are completed. For a frequency set of 10 and both adjustment loops, the expected average iterations is about 5 iterations per frequency (about 100 seconds to make measurements at all frequencies).

Figure 15:
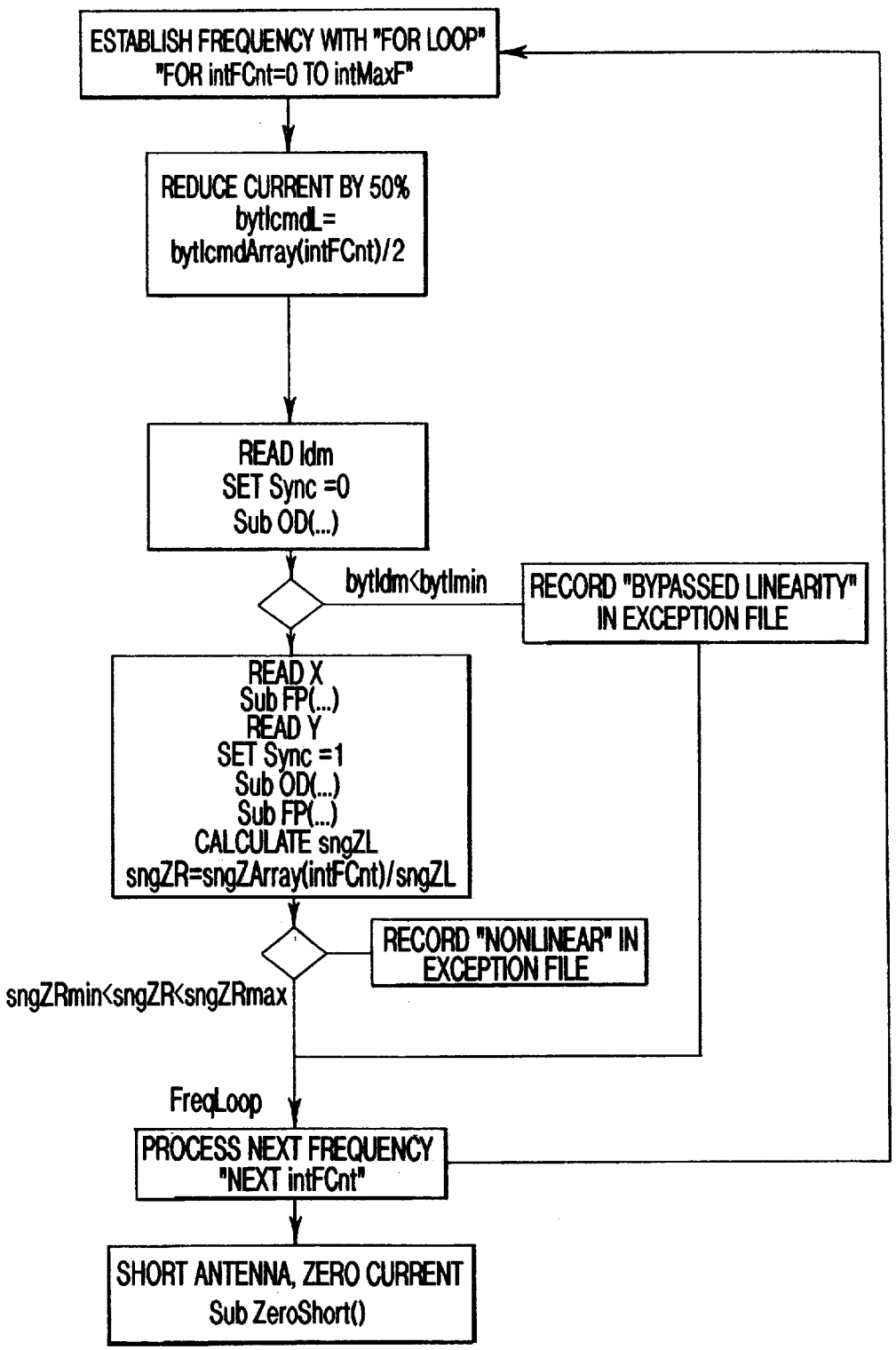
FIG. 15 is a subsection of FIG. 13c showing the test for linearity software flow diagram for TIMIS.

Turning to FIG. 15, to test for linearity:

1) The current command is reduced by 50%, and Z is determined for this lower current. If the system is "perfectly" linear then the ratio (ZR) of the originally measured Z to this "lower" Z (ZL) is the ratio of the adjusted (calibrated) drive current $I_d$ to the lower current $I_{dL}$.

2) Tests are made to ensure the lower current is in bounds. An exception is recorded for an out of bounds current, and the linearity test is bypassed.

3) This ratio is tested to see if it is within 25% of the expected ratio.

4) If not, a "non-linear" exception is recorded.

5) A linearity measurement is then made at the next frequency.

The calibration, manual, and automatic programs all manipulate "raw" measurements from the oscillator driver and field probe. These measurements are in unitless "counts" from an A/D converter: 8-bit A/D for $I_{dm}$ (0–255) from the oscillator driver and 12-bit A/D (0–4095) for x and y from the field probe. Most commands from the base station are unitless commands to set switches and include Sync (0, 1); Current range (0, 1); Current magnitude (0–15); Gain (0, 1); and Antenna (0, 1).

The frequency command to the oscillator driver is a 12-bit count (0–1023) that is interpreted by the oscillator driver as 1 kHz/count. The raw measurements are displayed unadjusted in the calibration program except for phase (degrees) and delay (microseconds).

For the manual and automatic programs the raw measurements (counts) are converted to calibrated measurements with units via calibration factors where $C_p$ is RMS microvolts/meter per count, $C_{delay}$ is in microseconds, and $C_d$ is RMS milliamps per count.

Thus, the units for the calibrated measurements are $V_{ef}$ magnitude in RMS microvolts/meter, $I_d$ magnitude in RMS milliamps, TI amplitude in milliohms, and TI phase in degrees.

Each subroutine or function is extensively commented in the source code with an opening description of its purpose and function and with imbedded comments on its processing. This section lists the more important subroutines and functions with a brief statement of purpose. The intent is to provide an overview of the source code.

The Sub FieldProbe( . . . ) communicates between the base station and the field probe. It controls antenna, gain, and measurement delay, and acquires XY. The Sub OscillatorDriver( . . . ) communicates between the base station and the oscillator driver. It controls sync, frequency, and current range and magnitude, and acquires $I_{dm}$. The Sub Offsets( ) measures offsets for in-phase and quadrature sync with the antenna shorted. The Sub MeasureAll( . . . ), at a given frequency, current setting, and gain setting, acquires $I_{dm}$ and XY. Sub ZeroShort( ) shorts the antenna and sets $I_d=0$.

The present software provides the primary base station functions and meets all requirements for the transfer impedance measurement of explosives structures, which is the primary purpose of the TIMIS. However, TIMIS software can also include the ability to provide preliminary building reports; an automated and integrated calibration process; enhanced system diagnostics; control for direct-connection current or voltage measurements discussed above; control for other sensors and their measurements; and test scripts to validate future software changes. The GUIs can also be modified as field experience is gained.

As stated, the present embodiment has been optimized for the explosives structure application. The design theme for the present embodiment was to keep the circuitry as simple as this initial application permits and to subsume into software features expected to evolve. This strategy provides a reliable, producible, and flexible TIMIS. However, any or all of the foregoing variations, all within the known art, can be implemented on TIMIS. With or without these variations, TIMIS can be used with alternative sensors to measure a variety of impedances, currents, voltages, or magnetic fields other than the transfer impedances for which the present embodiment is optimized.

TIMIS can be used advantageously in any other application that requires measurement of the low-frequency, transfer impedance of well-shielded volumes with low drive currents. Suitable applications of this type are measurement of the lightning response of 'structures' such as aircraft, automobiles, trucks, rail vehicles, and electronics housings. TIMIS can also be used to perform conducted susceptibility measurements of the electromagnetic interference of electronics and full systems.

Industrial Applicability

The invention is further illustrated by the following non-limiting examples.

EXAMPLE

Synchronous Detection as Implemented in TIMIS

This discussion considers the processing of the various TIMIS measurement information to determine the received electric field voltage at the field probe and subsequently to determine the transfer impedance function. This processing occurs both in hardware and firmware at the field probe and oscillator driver, and in the base station software.

The signal $S_1$ is the output of preamplifier 50 (of FIG. 5), amplified $V_{ef}$, in response to the structure excitation by $I_d$, the drive current. Upper-case signal names in this discussion indicate the frequency domain; lower-case signal names indicate the time domain.

$$s_1(t)=AV_{ef}(t)=A\sin(2\pi ft+\phi)=A\sin(u+\phi)$$

where:

$$u=2\pi ft$$

f—frequency, t—time $$V_{ef}(t)=A_p\sin(2\pi ft+\phi_p)$$

$V_{ef}(t)$, $V_{ef}$—electric field voltage at the probe $$A=G_a G_{pa} A_p$$

$A_p$—amplitude of the electric field voltage $\phi_p$—phase of the electric field voltage $G_{pa}$—net gain through the preamplifier for the selected preamplifier setting $$\phi=\phi_p+\phi_{pa}$$

$G_a$—gain (loss) of the antenna $\phi_{pa}$—net phase shift through the preamplifier at the selected preamplifier setting $S_1$ is multiplied by the square-wave sync signal and then averaged. The sync signal has two forms in this process: in-phase and quadrature (shifted ¼ period).

In-phase sync($u$)=1 for $u$=0 to $\pi$=−1 for $u$=$\pi$ to 2$\pi$

Quadrature sync($u$)=1 for $u$=$\pi$/2 to 3$\pi$/2=−1 for $u$=3$\pi$/2 to 5$\pi$/2

Consider first the in-phase interim measurement in which the in-phase sync is transmitted to the field probe from the base station. The following equations represent the multiplication of $s_1$(t) by sync and the subsequent averaging, all in the field probe, to produce $s_3$(t).

In-phase Detection $$s_3(t) = \frac{1}{2\pi}\int_0^{2\pi} A\sin(u+\varphi)\text{sync}(u)du$$

$$s_3(t) = \frac{1}{2\pi}\int_0^{\pi} A\sin(u+\varphi)du - \frac{1}{2\pi}\int_{\pi}^{2\pi} A\sin(u+\varphi)du$$

$$s_3(t) = \frac{1}{2\pi}A\{-\cos(u+\varphi)|_0^{\pi} + \cos(u+\varphi)|_{\pi}^{2\pi}\}$$

$$s_3(t) = \frac{1}{2\pi}A\{-\cos(\pi+\varphi) = \cos\varphi + \cos(2\pi+\varphi) - \cos(\pi+\varphi)\}$$

$$s_3(t) = \frac{1}{2\pi}A\{\cos\varphi + \cos\varphi + \cos\varphi + \cos\varphi\}$$

$$s_3(t) = (2/\pi)A\cos\varphi$$

| | |
|---|---|
| $s_4(t) = (2/\pi)G_{det}A\cos\phi$ | $S_4$- interim measurement amplified by post integrator amplifier |
| | $G_{det}$ - detector gain, the composite gain of the multiplier, averager, and amplifier |
| $x = s_4(t) = (2/\pi)G_{det}A\cos\phi$ | $x$ - in-phase interim measurement |

Quadrature Detection $$s_3(t) = \frac{1}{2\pi}\int_{\pi/2}^{5\pi/2} A\sin(u+\varphi)\text{sync}(u)du$$

$$s_3(t) = \frac{1}{2\pi}\int_{\pi/2}^{3\pi/2} A\sin(u+\varphi)du - \frac{1}{2\pi}\int_{3\pi/2}^{5\pi/2} A\sin(u+\varphi)du$$

$$s_3(t) = \frac{1}{2\pi}A\{-\cos(3\pi/2+\varphi) + \cos(\pi/2+\varphi) +$$
$$\cos(5\pi/2+\varphi) - \cos(3\pi/2+\varphi)\}$$

$$s_3(t) = -(2/\pi)A\sin\varphi$$

$$y = s_4(t) = -(2/\pi)G_{det}A\sin\varphi$$

$y$—quadrature interim measurement

At the base station these two interim measurements, x and y, are processed to produce a point on the transfer impedance function at the frequency, f, selected for the measurement. First the electric field voltage at the probe having amplitude, $A_p$, and phase, $\phi_p$ is calculated.

Amplitude $$x^2+y^2=(4/\pi^2)G_{det}^2A^2\cos^2\phi+(4/\pi^2)A^2G_{det}^2\sin^2\phi=(4/\pi^2)G_{det}^2A^2(\cos^2\phi+\sin^2\phi)=(4/\pi^2)G_{det}^2A^2=z^2$$

$A=\pi z/(2G_{det})$ $A_p=\pi z/(2G_{det}G_aG_{pa})$

Phase $$y/x = -\frac{\frac{2}{\pi}G_fA\sin\varphi}{\frac{2}{\pi}G_fA\cos\varphi} = -\frac{\sin\varphi}{\cos\varphi} = -\tan\varphi$$

$\phi=-\arctan(y/x)$ $\phi_p=-\arctan(y/x)-\phi_{pa}$

As stated, the variables, x and y, are determined by measurement. The gains, $G_a$, $G_{pa}$, and $G_{det}$, are predetermined by the TIMIS calibration as a single calibrated scaling coefficient, $C_p=A_p/z$. See Table 1 above. Thus, the amplitude of the electric field voltage at the antenna is determined, as $A_p=zC_p$.

Recall that the drive current producing this electric field voltage is

| | |
|---|---|
| $i_d(t) = A_d\sin(2\pi ft + \phi_d)$ | $I_{dm}$ - unscaled amplitude of the drive current, measured by the current driver |
| $A_d = I_{dm}C_d$ | $A_d$ - amplitude of $i_d(t)$ |
| | $\phi_d$ - phase of $i_d(t)$ |
| | $C_d$ - calibration factor for $I_{dm}$ |

The calibrated scaling coefficient, $C_d$, is also determined during calibration. See Table 1. Thus, the transfer impedance function has the following amplitude, $A_{TI}$, at the selected measurement frequency:

$A_{TI}=(A_p/A_d)/h$ h—height of the roof

A set of these amplitude measurement/calculations for a prescribed set of frequencies produces the desired transfer impedance function amplitude. The determination of $\phi_{TI}$, the phase of the transfer impedance function, is similar.

$\phi_p=\phi_{TI}+\phi_d$ $\phi_{TI}=-\arctan(y/x)-\phi_{pa}-\phi_d$

However, $\phi_d<<\phi_{TI}$. Thus, $\phi_{TI}=-\arctan(y/x)-\phi_{pa}$.

This approximation is discussed below under Discussion of $I_d$ Phase. A circuit to measure $\phi_d$ is discussed above with regard to the phase measuring circuit.

$\phi_{pa}$ is determined from $C_{delay}$, the preamp delay predetermined in calibration. See Table 1. The calibration process, which couples an oscillator driver and field probe pair, also folds the small $I_d$ delay into $C_{delay}$. This further supports the approximation. Also, the general relationship between phase and delay is the following:

$\phi=-2\pi f\text{Delay}$.

Thus, $\phi_{TI}=-\arctan(y/x)+2\pi fC_{delay}$

Figure 9:
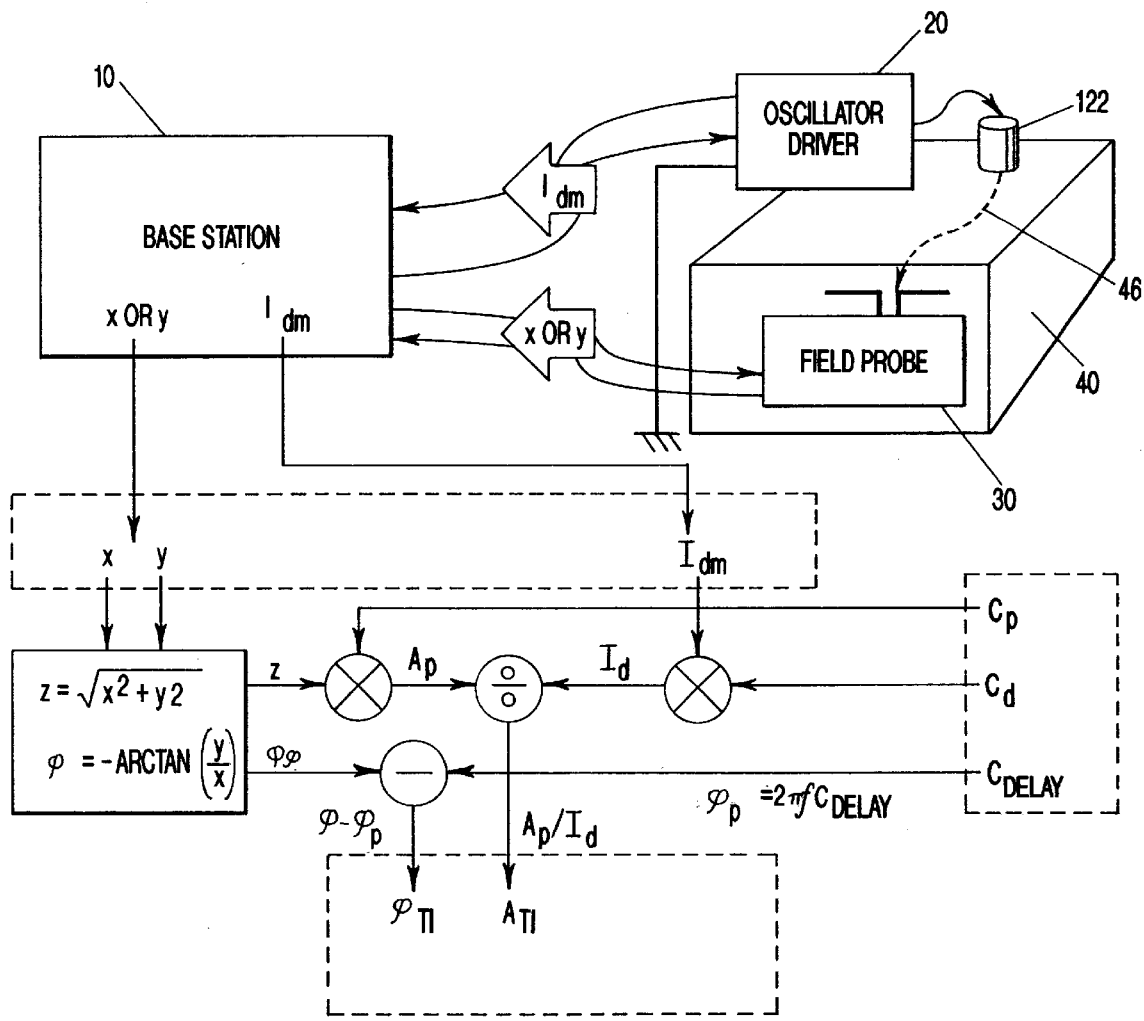
FIG. 9 is a block diagram for information processing for manual or automatic measurement using TIMIS.

These calculations are depicted in FIG. 9 where $C_p$ is the electric field amplitude calibration, $C_d$ is the calibration factor for $I_{dm}$, and $C_{delay}$ is the electric field delay calibration.

Discussion of Square-wave Sync Signal

Two types of sync signals are available for TIMIS: a sinusoidal sync signal, and a square-wave sync signal (used in the present embodiment and the derivation of synchronous detection above). Either will extract the very small $V_{ef}$ from a high noise environment. A sinusoidal sync signal has the advantage that it rejects all harmonics that might occur in $I_d$. The sinusoidal sync has the disadvantage that it requires more extensive circuitry. Therefore, either the sinusoidal sync signal must be transmitted/received in analog form, which requires extensive modulation circuitry in both the oscillator driver and the field probe, or the sinusoidal sync signal must be constructed in the field probe from the square-wave sync signal. This also requires extensive circuitry.

In order to keep TIMIS as simple as practical for the intended use, a square-wave sync was selected for the present embodiment. This allows simple transmission and reception circuitry and allows simple scaling and shifting circuitry prior to multiplication with the amplified $V_{ef}$. However, the square-wave sync signal rejects even harmonics of $I_d$ but detects odd harmonics. Consider the $3^{rd}$ harmonic of $I_d$ as represented in $V_{ef}$: Then $S_1 = A_3 \sin(3\omega t + \phi)$. Considering in-phase sync and using the same equations as before, $S_3 = (1/3)(2A_3/\pi)\cos(\phi)$. Similarly for the $5^{th}$ harmonic, $S_3 = (1/5)(2A_5/\pi)\cos(\phi)$. As indicated, the detection of the odd harmonics in $I_d$ decreases as $1/n$.

The odd harmonics are very low in $I_d$, as experimental data has shown. That is, in the present embodiment, the oscillator driver produces a sine-wave with low harmonic distortion. Further, environmental noise at these frequencies will not be synchronized and will thus be rejected. Finally, the calibration process tends to reduce the very small effect of the odd harmonics in $I_d$. Thus, the use of a square-wave sync signal has proven to be a prudent design choice. However, TIMIS can also be implemented with a sine-wave sync signal.

An Alternate Method of Synchronous Detection

An alternate method to determine $A_{TI}$ and $\phi_{TI}$ can be used, and it was successfully used in the earliest version of the TIMIS. For this method, the phase of the drive current is shifted relative to the sync to maximize $S_3$. This variable phase, $\phi_v$, is added to the phase of $S_1$.

$$\phi = \phi_p + \phi_{pa} + \phi_v$$

For In-phase Sync $$S_3 = (2/\pi)A\cos\phi$$

For $\phi = 0$, $\cos\phi = 1$, and the maximum value for $S_3$ occurs. Thus, the value for $\phi_v$ is, $$\phi_v = -(\phi_p + \phi_{pa})$$

The values for $S_3$ and x are $$S_3 = (2/\pi)A$$

$$x = (2/\pi)A_I A$$

For Quadrature Sync $$S_3 = -(2/\pi)A\sin\phi = -(2/\pi)A\sin(0) = 0$$

$$y = 0$$

Thus, the detector is used to make only the measurement, x. The following calculations for the transfer impedance value at a selected frequency result:

$$A_p = x/(2A_p A_I/\pi)$$

$$A_{TI} = (A_p/A_d)/h$$

$$\phi_{TI} = \phi_p = -\phi_{pa} - \phi_v$$

Although this method appears to require only one measurement, in fact it requires multiple measurements to adjust $\phi_v$ to achieve a maximum for x. Thus, for quicker operation of the TIMIS, in-phase and quadrature interim measurements are taken and processed as described previously.

Discussion of $I_d$ Phase

The approximation, $\phi_d << \phi_{TI}$, results from the fact that, for the explosive shelters under consideration, the reactive element of the load on $I_d$, $CVR + R_g + j\omega L_g + Z_s$, are small with respect to the resistive element of the load. This is seen from the simple but accurate lumped parameter modeling equations:

$$V_{ef} = Z_s I_d/h$$

$$I_d = S_7(CVR + R_g j\omega L_g + Z_{re} + jZ_{im})$$

Where, $$Z_s = Z_{re} + jZ_{im}$$

$Z_s$—structure impedance
$Z_{re}$—real part of $Z_s$
$Z_{im}$—imaginary part of $Z_s$
$R_g$—ground resistance
$L_g$—ground inductance For an R/L transfer impedance, $$Z_{re} = R_s$$

$R_s$—structure resistance $$Z_{im} = j\omega L_s$$

$L_s$—structure inductance $$\phi_d = -\arctan[(\omega L_g + \omega L_s)/(CVR + R_g R_s)] \text{If } (\omega L_g + \omega L_s) << CVR + R_g + R_s,$$
$$\phi_d \sim (\omega L_g + \omega L_s)/(CVR + R_g + R_s) \sim 0$$

For the TIMIS measurement of explosives structures $\omega L_g + \omega L_s$ will be maximum at f=1,000 kHz. Analysis indicates that $L_g$ is about 0.5 microHenries or less for a composite of four 10-gauge, 3-conductor cables in parallel, which is 12 wires in parallel. Also, field measurements indicate that a large $L_s$ is 100-nanoHenries. Thus ($\omega L_g + \omega L_s$) <3-ohms at 1,000 and proportionately less at lower frequencies. $CVR + R_g + R_s$ is always greater than 50 ohms, typically somewhat greater than 100 ohms, and perhaps as high as 1,000 ohms. The phase error caused by this approximation will be about 0.02° at 10 kHz, 0.2° at 100 kHz, and 2.0° at 1,000 kHz. Thus, the approximation is appropriate for explosives storage structures.

However the validity of this approximation can be tested in the field. First, the TIMIS antenna can be removed and the field probe can measure $I_d$ phase by measuring the voltage across a 1-ohm CVR in the $I_d$ circuit. An attenuation pad would be used to reduce the voltage to the field probe to be "in-range." Second, an impedance meter could be used to measure the inductance of the $I_d$ circuit.

Brief User's Guide

A brief user's guide is included here to provide a single inclusive overview of the software.

Selecting the Measurement Mode

Action:
    Click the TIMIS icon on the desktop.
Response:
    The Welcome to TIMIS GUI appears (FIG. 10a).

Action:
  Select Automatic Measurement, Manual Measurement, or Calibration.
Response:
  Automatic Measurement—TIMIS Automatic Measurement—Path Information GUI appears (FIG. 10d).
  Manual Measurement—TIMIS Manual measurement GUI appears (FIG. 10c).
  Calibration—TIMIS Calibration GUI appears (FIG. 10b).

Before proceeding to the next GUI, TIMIS performs a communications test. If a communications error occurs, then a warning is issued, and processing is terminated. Since communications occur continuously during measurement, this warning may occur at any time. The response to the warning is the same, and the measurement must be restarted at the opening GUI (FIG. 10a). However, since TIMIS has a simple and reliable communications design, if a communications error occurs it will likely occur immediately.

Automatic Measurement Mode

Figure 11A:
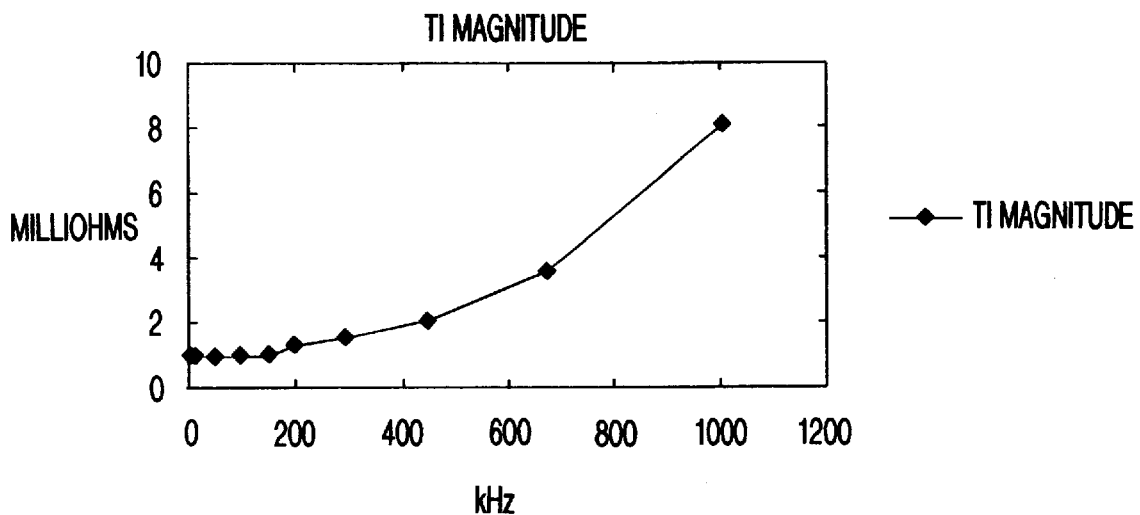
FIG. 11a shows a plot of transfer impedance magnitude as a function of frequency.
Figure 11B:
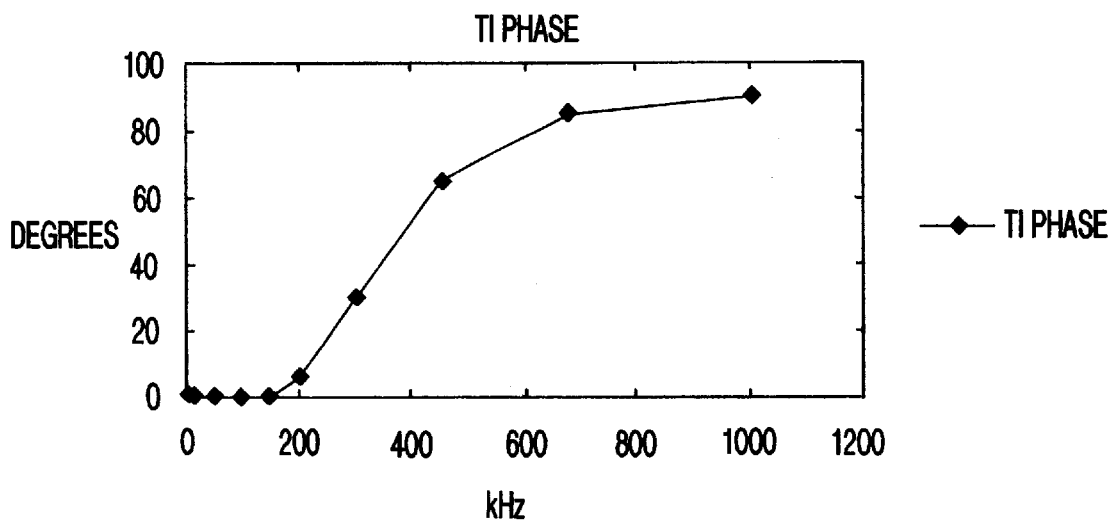
FIG. 11b shows a plot of transfer impedance phase as a function of frequency.

The automatic measurement is the standard TIMIS measurement mode for field operations. A complete measurement at a field probe measurement position is automatically made after the user has specified path and file names for storing the measurement information. The field probe is then repositioned for the next measurement, but the oscillator driver is unmoved. For each position the automatic measurement adjusts both the field probe and the oscillator driver internal controls, takes measurements over a specified set of frequencies, stores the results in Excel measurement tables, such as shown in Tables 3a, 3b and 3c above, and finally plots the transfer impedance (FIGS. 11a–b). During the measurement, messages about the measurement progress and possible warnings are displayed at the GUI. After the measurement the user may view the Excel Measurement Tables.

Specifying the Location/site Path Naming Information (FIG. 10d) for the Excel Measurement Tables Actions:
    Enter the operator's name.
    Enter the test location (use only Windows file name characters).
    Enter the site name (use only Windows file name characters).
    Click OK.
  Response:
    TIMIS Automatic Measurement GUI appears (FIG. 10e).

Specifying the Position Naming Information for the Excel Measurement Tables

Actions:
    Enter the position name (use only Windows file name characters).
    Enter the ceiling height.
    Click Begin Test.
  Responses:
    1. If a position name was specified that had previously been used, a warning window appears. The user may use the specified position name; this causes the previously stored measurement information to be overwritten. Or, the user may rename the position.
    2. As the automatic measurement progresses messages are displayed at the GUI:

a)
    Measuring.
    Antenna connected.
    Frequency =xxxx kHz.
    Adjustment =xx.
    Note: "Adjustment" indicates the number of drive current and gain adjustments made at a frequency to achieve the measurement. For measurement at the first frequency, this number may be as high as 50. For measurement at subsequent frequencies, it will probably be less than 10.
  b)
    Low drive current!
    Measurement terminated!
    Antenna shorted.
    Drive current zero.
    Must restart measurement!
    Note: If TIMIS is properly connected this message should not occur. This message probably indicates a bad connection of the oscillator driver to the structure (either to the roof or to earth). Also, the manual measurement mode can be used to test for a good connection. The automatic measurement must be restarted by clicking "form close X."
  c)
    Testing linearity.
    Antenna connected.
    Frequency =xxxx kHz.
  d)
    Measurement complete.
    Antenna shorted.
    Drive current zero.
    Transferring data to Excel.
    (Close Excel after review!)
  e)
    Measurement complete.
    Antenna shorted.
    Drive current is zero.
    Exceptions recorded.
    Transferring data to Excel.
    (Close Excel after review!)
    Note: As discussed above, if the measurement cannot be adjusted to the desired mid-range then in most cases the measurement is made anyway, but an "exception" is recorded and a warning is issued at the GUI. Exceptions are recorded for the following: $V_{ef}$ too low, $V_{ef}$ too high, nonlinear, high noise, and inaccurate phase.
  f)
    Measurement complete.
    Antenna shorted.
    Drive current is zero.
    Ready to measure at next position.
  g)
    Measurement complete.
    Antenna shorted.
    Drive current is zero.
    Exceptions recorded.
    Ready to measure at next position.
    3. Unseen by the user, all measurements and settings are stored in the Excel measurement tables (Tables 3a, 3b and 3c). A plot of transfer impedance appears (FIGS. 11a and 11b) between the display of messages d or e and f or g. This plot is on the "Primary"

sheet of the Excel file for this measurement position. Also on the Primary sheet is the Primary table (Table 3a). On the Secondary sheet is the Secondary table (Tables 3b and 3c). After reviewing these Excel plots and tables (Primary and Secondary tables) the user may make notes in the Comments sheet. The final user action after the review, as prompted in message d or e, is to save the file and close Excel. After Excel closes the message f or g appears and TIMIS is ready to measure at a new position.

To View the Excel Measurement Tables After Closure of TIMIS

1. Open Excel and
2. Open the file C:\Program Files\TIMIS\Testing\"location name"\"site name"\"position name".

Manual Measurement Mode

The manual measurement allows the user to specify the measurement frequency (1 kHz to 1,000 kHz in steps of 1 kHz), the drive current (magnitude, 0 to 15; and range, low or high), and the preamp gain (low or high). Also, the ceiling height is specified. All of these use inputs are in the top half of the GUI (FIG. 10c). The TIMIS responds by displaying the measurements in the bottom half: amplitude of drive current, amplitude of electric field voltage, and amplitude and phase of the transfer impedance.

To Measure for the Specified Input Variables

Actions:
Specify inputs.
Click Measure.

Response:
Measurements are continuously made and displayed.

Notes:
1. The measurement cycle is about 5 seconds, so wait about 10–15 seconds for the measurement to stabilize after
   a) the inputs have been changed, or
   b) the load on the system has been changed.
2. Since the user has full control of the drive current and gain, the user can inadvertently command an "out-of-range" measurement. A warning is issued at the GUI, but the measurement is made and displayed none the less. If possible the drive current and/or gain should be adjusted to achieve an in-range measurement.
3. The manual measurement allows measurements at frequencies not in the automatic measurement frequency set.
4. The manual measurement allows investigation of unusual measurements that occur in automatic measurement: exceptions or low drive current.

To Stop Measuring

Action:
Click Stop.

Response:
TIMIS stops measuring after completion of the current measurement.

Note: In this state, modifications to TIMIS connections can be made without causing communication errors.

To Exit

Action:
Click Exit.

Response:
The measurement is terminated after the current measurement is completed.

Calibration Mode

The calibration mode (FIG. 10b) is similar to the manual measurement mode except that the measurements of drive current ($I_{dm}$, 0–255) and electric field amplitude (z, 0–4095) are not adjusted with calibration coefficients but are displayed as dimensionless counts. The delay (microseconds) and phase (degrees) are, however, displayed in physical units. Also, the measurement can be made of drive current only.

To Measure for the Specified InDut Variables

Actions:
Specify inputs.
Click Measure.

Response:
Measurements are continuously made and displayed.

Notes: The measurement cycle is about 2.5 seconds, so wait about 5–10 seconds for the measurement to stabilize after
   a) the inputs have been changed, or
   b) the load on the system has been changed.

To Stop Measuring

Action:
Click Stop.

Response:
TIMIS stops measuring after completion of the current measurement.

Note: In this state, modifications to TIMIS connections can be made without causing communication errors.

To Exit

Action:
Click Exit.

Response:
The measurement is terminated after the current measurement is completed.

The preceding example can be repeated with similar success by substituting the generically or specifically described operating conditions of this invention for those used in the preceding examples.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A system for measuring the transfer impedance of a structure, said system comprising:
   a base station for control of the transfer impedance measurement of the structure;
   an oscillator driver in communication with said base station, for producing a small electrical drive signal into the structure, thereby producing an electric field within the structure that is less than 10,000 microvolts/meter, the drive signal measured and controlled by said base station; and
   a field probe for detecting the electric field within the structure produced by the electrical drive signal driven into the structure, said field probe in communication with said base station, said base station calculating transfer impedance based upon the drive signal and electric field measured by said base station.

2. The system of claim 1 wherein said base station and said oscillator driver are in communication via a wireless link.

3. The system of claim 1 wherein said base station and said field probe are in communication via a wireless link.

4. The system of claim 1 wherein said field probe comprises a field probe capable of detecting electric fields ranging from 1 to 10,000 microvolts/meter.

5. The system of claim 1 further comprising isolated power supplies for each of said base station, said oscillator driver, and said field probe.

6. The system of claim 5 wherein each of said isolated power supplies comprises at least one power supply selected from the group of power supplies consisting of batteries, pneumatically-driven generators powered by gas via non-conducting tubing, hydraulically-driven generators powered by non-conductive fluid via non-conducting hoses, photocells powered by light via fiber optics, and fuel cells.

7. The system of claim 1 wherein said base station comprises:
a computer for storing and executing software;
software for control of the transfer impedance measurement; and
a communications interface for communication with said oscillator driver and said field probe.

8. The system of claim 1 wherein said base station comprises means for determining transfer impedance amplitude and phase.

9. The system of claim 1 wherein said oscillator driver comprises an oscillator driver for driving an electrical signal that is less than one-millionth the magnitude of lightning.

10. The system of claim 9 wherein said oscillator driver comprises an oscillator driver for driving an electrical signal that is less than 500 milliamps.

11. The system of claim 10 wherein said oscillator driver comprises an oscillator driver for driving an electrical signal that is between 10 and 400 milliamps.

12. The system of claim 9 wherein said oscillator driver comprises an oscillator driver for driving an electrical signal that is less than 28 volts.

13. The system of claim 1 further comprising at least one isolated regulator for each of said oscillator driver and said field probe.

14. The system of claim 1 wherein said oscillator driver comprises an oscillator driver for driving an AC electrical signal having a frequency range specific to lightning susceptibility for determining transfer impedance as a function of frequency.

15. The system of claim 14 wherein said oscillator driver comprises an oscillator driver for driving an AC electrical signal that is greater than 1 kilohertz.

16. The system of claim 1 wherein said oscillator driver comprises:
an oscillator to produce said electrical drive signal at selected frequencies;
a driver to amplify said electrical drive signal from said oscillator;
a communications interface for communication with said base station;
a microcontroller to process and enact commands received from said base station, to send data to said base station, and to control said electrical drive signal; and
a multiplexer, resistance, and a peak detector for determining the measured electrical drive signal.

17. The system of claim 1 wherein said oscillator driver comprises a phase measurement circuit to be used by said base station in calculating transfer impedance phase.

18. The system of claim 1 wherein said field probe comprises an electromagnetic shield for containing a synchronous detector.

19. The system of claim 1 wherein said field probe comprises an antenna capable of measuring parameters selected from the group of parameters consisting of normal electric fields near a conducting ground plane, magnetic fields, directly-connected currents, directly-connected voltages, and electro-magnetic fields.

20. The system of claim 1 wherein said field probe comprises an electromagnetically invariant system.

21. The system of claim 1 wherein said field probe comprises a dipole antenna.

22. The system of claim 21 wherein said dipole antenna comprises:
a skinny half-dipole antenna; and
a fat half-dipole antenna.

23. The system of claim 1 further comprising a synchronization source to provide a synchronous timing signal between said oscillator driver and said field probe to permit synchronous detection of the electric field by said field probe.

24. The system of claim 23 wherein said synchronization source is a component of said oscillator driver.

25. The system of claim 23 wherein said synchronization source is a component of said base station.

26. The system of claim 23 wherein said field probe further comprises a synchronous electric field detector for synchronous detection of the electric field produced by the electrical drive signal into the structure.

27. The system of claim 6 wherein said field probe comprises a skinny half-dipole and a fat half-dipole, said fat half-dipole enclosing said synchronous electric field detector, a power supply, regulation circuitry, and a fiber optic interface, said interface in communication with said base station to receive commands from said base station, to send detected signals to said base station, and to receive the sync signal, thereby providing noise shielding, high electric field sensitivity, and electromagnetic isolation and invariance.

28. The system of claim 27 wherein said field probe senses the electric field parallel to the axis of said dipole and rejects non-axial components of the electric field.

29. The system of claim 27 wherein said field probe further comprises a non-conducting stand that said dipole is mounted upon for isolating said dipole from the surrounding environment.

30. The system of claim 1 wherein said base station comprises means for automatically stepping said oscillator driver through a set of frequencies and adjusting drive signal magnitude at each frequency for optimal electric field detection, and recording the resulting measured electric field and measurement parameters therefore at each frequency; and further lowering the drive signal magnitude by a specified amount from that of the original measurement at each frequency, and recording the resulting measured electric field and measurement parameters therefore at each frequency, thereby providing an indication of measurement linearity to the user.

31. The system of claim 1 wherein said base station measures at least one type of noise selected from the group consisting of external environmental noise and internal electronic noise.

32. The system of claim 1 wherein said base station determines whether the electric field detected by said field probe is in a range measurable by said base station, and provides an indication of the detection range to the user on a display of said base station.

33. The system of claim 1 wherein said base station displays in-situ plots of transfer impedance to the user.

34. The system of claim 1 wherein said base station comprises means for storing data input by the user and data obtained during measurements and calculations.

35. The system of claim 1 wherein said base station, said field probe, and said oscillator driver are physically and electrically isolated from each other, each of said base station, said field probe, and said oscillator driver containing respective isolated power supplies, said base station and said field probe in communication via wireless links, and said base station and said oscillator driver in communication via wireless links, such that said field probe operating in conjunction with said base station is capable of detecting electric fields from noise having spectral energy greater than 100 times the magnitude of the electric field produced by the drive signal from said oscillator driver.

36. The system of claim 1 wherein said base station, oscillator driver, and field probe are physically and electrically isolated from each other, each having respective isolated power supplies, said base station and said field probe in communication via wireless links, and said base station and said oscillator driver in communication via wireless links, to enhance at least one feature selected from the group consisting of explosives safety, personnel safety, noise rejection, and electromagnetic invariance.

37. A method of measuring transfer impedance of a structure, the method comprising the steps of:
    a) driving a small electrical drive signal into a structure with an oscillator driver, thereby producing an electric field within the structure that is less than 10,000 microvolts/meter;
    b) detecting the electric field within the structure produced by the electrical drive signal driven into the structure, with a field probe;
    c) communicating between the base station and oscillator driver and between the base station and field probe, and controlling the electrical drive signal, measuring the electrical drive signal, and measuring the electric field with the base station; and
    d) calculating the transfer impedance of the structure from the measured drive signal and the measured electric field with the base station.

38. The method of claim 37 further comprising the step of communicating between the base station and oscillator driver via a wireless link.

39. The method of claim 37 further comprising the step of communicating between the base station and field probe via a wireless link.

40. The method of claim 37 wherein the step of detecting the electric field of the structure produced by the electrical drive signal with a field probe comprises detecting electric fields ranging from 1 to 10,000 microvolts/meter.

41. The method of claim 37 further comprising the step of isolating the power supplies for each of the base station, oscillator driver, and field probe.

42. The method of claim 41 wherein the step of isolating the power supplies comprises isolating the power supplies by using at least one power supply selected from the group of power supplies consisting of batteries, pneumatically-driven generators powered by gas via non-conducting tubing, hydraulically-driven generators powered by non-conductive fluid via non-conducting hoses, photocells powered by light via fiber optics, and fuel cells.

43. The method of claim 37 wherein the step of detecting the electric field of the structure comprises synchronously detecting the electric field.

44. The method of claim 37 wherein the steps of controlling the transfer impedance measurement with a base station and determining the transfer impedance of the structure from the electric field detection with a base station comprise:
    a) storing and executing software on a computer;
    b) controlling the transfer impedance measurement with the software; and
    c) communicating with the oscillator driver and field probe.

45. The method of claim 37 wherein the step of determining the transfer impedance of the structure from the electric field detection with a base station comprises determining transfer impedance amplitude and phase of the structure from the electric field detection with a base station.

46. The method of claim 37 wherein the step of driving a small electrical drive signal into a structure with an oscillator driver comprises driving an electrical signal that is less than one-millionth the magnitude of lightning.

47. The method of claim 46 wherein the step of driving an electrical signal that is less than one-millionth the magnitude of lightning comprises driving an electrical signal that is less than 500 milliamps.

48. The method of claim 47 wherein the step of driving an electrical signal that is less than 500 milliamps comprises driving an electrical signal that is between 10 and 400 milliamps.

49. The method of claim 46 wherein the step of driving an electrical signal that is less than one-millionth the magnitude of lightning comprises driving an electrical signal that is less than 28 volts.

50. The method of claim 37 further comprising the step of isolating at least one regulator for each of the oscillator driver and field probe.

51. The method of claim 37 wherein the step of driving a small electrical drive signal with an oscillator driver comprises driving an AC electrical signal having a frequency range specific to lightning susceptibility for determining transfer impedance as a function of frequency.

52. The method of claim 51 wherein the step of driving an AC electrical signal having a frequency range specific to lightning susceptibility comprises driving an AC electrical signal that is greater than 1 1 kilohertz.

53. The method of claim 37 wherein the step of driving a small electrical drive signal into a structure with an oscillator driver comprises:
    a) producing the electrical drive signal at selected frequencies with an oscillator;
    b) amplifying the electrical drive signal with a driver;
    c) communicating with the base station via a communications interface;
    d) processing and enacting commands received from the base station, sending data to the base station, and controlling the electrical drive signal, with a microcontroller; and
    e) determining the measured electrical drive signal with a multiplexer, resistance, and a peak detector.

54. The method of claim 37 wherein detecting the electric field of the structure produced by the electrical drive signal with a field probe comprises detecting the electric field of the structure with an electromagnetically invariant system.

55. The method of claim 37 further comprising the step of measuring parameters selected from the group of parameters consisting of normal electric fields near a conducting ground plane, magnetic fields, directly-connected currents, directly-connected voltages, and electro-magnetic fields.

56. The method of claim 37 wherein detecting the electric field of the structure produced by the electrical drive signal with a field probe comprises shielding a synchronous detector with an electromagnetic shield.

57. The method of claim 37 wherein the step of detecting the electric field of the structure produced by the electrical drive signal with a field probe comprises detecting the electric field of the structure produced by the electrical drive signal with a dipole antenna.

58. The method of claim 57 wherein the step of detecting the electric field of the structure produced by the electrical drive signal with a dipole antenna comprises detecting the electric field of the structure produced by the electrical drive signal with a skinny half-dipole antenna and a fat half-dipole antenna.

59. The method of claim 37 further comprising the step of measuring at least one type of noise selected from the group consisting of external environmental noise and internal electronic noise with the base station.

60. The method of claim 37 further comprising the steps of determining whether the electric field detected by the field probe is in a range measurable by the base station, and providing an indication of the detection range to the user on a display of the base station.

61. The method of claim 37 further comprising the step of displaying in-situ plots of transfer impedance to the user on the display of the base station.

62. The method of claim 37 further comprising the step of storing data input by the user and data obtained during measurements and calculations in the base station.

63. The method of claim 37 further comprising the steps of physically and electrically isolating the base station, field probe, and oscillator driver; communicating between the base station and field probe and between the base station and oscillator driver via wireless links; providing isolated power supplies to each of the base station, field probe, and oscillator driver; and detecting electric fields from noise having spectral energy greater than 100 times the magnitude of the electric field produced by the drive signal from said oscillator driver.

64. The method of claim 37 wherein the step of controlling the transfer impedance measurement with a base station comprises:
 a) selecting the appropriate measurement parameters for the structure to be measured;
 b) recording raw data detected by the field probe;
 c) calculating at least one calculation selected from the group consisting of drive current into the structure; electric field within the structure; transfer impedance of the structure, and measurement integrity.

65. The method of claim 37 further comprising the steps of physically and electrically isolating each of the base station, field probe, and oscillator driver; communicating between the base station and oscillator driver, and between the base station and field probe via wireless links; and providing isolated power supplies for each, to enhance at least one feature selected from the group consisting of explosives safety, personnel safety, noise rejection, and electromagnetic invariance.

66. The method of claim 37 further comprising the steps of:
 a) automatically stepping the oscillator driver through a set of frequencies and adjusting drive signal magnitude at each frequency for optimal electric field detection;
 b) recording the resulting measured electric field and measurement parameters therefore at each frequency;
 c) lowering the drive signal magnitude by a specified amount from that of the original measurement at each frequency, and recording the resulting measured electric field and measurement parameters therefore at each frequency; and
 d) providing an indication of measurement linearity to the user.

67. The method of claim 37 further comprising the steps of providing a synchronization source for providing a synchronous timing signal between the oscillator driver and field probe, and synchronously detecting the electric field by the field probe.

68. The method of claim 67 further comprising the step of originating the synchronous timing signal from the oscillator driver.

69. The method of claim 67 further comprising the step of originating the synchronous timing signal from the base station.

70. The method of claim 67 further comprising the step of providing a synchronous electric field detector within the field probe for synchronous detection of the electric field produced by the electrical drive signal into the structure.

71. The method of claim 70 further comprising the steps of providing a field probe comprising a skinny half-dipole and a fat half-dipole, and enclosing the synchronous electric field detector, a power supply, regulation circuitry, and a fiber optic interface, within the fat half-dipole of the field probe; communicating the interface with the base station to receive commands from the base station, to send detected signals to the base station, and to receive the sync signal, thereby providing noise shielding, high electric field sensitivity, and electromagnetic isolation and invariance.

72. The method of claim 71 further comprising the step of sensing the electric field parallel to the axis of the dipole and rejecting non-axial components of the electric field.

73. The method of claim 71 further comprising the step of isolating the dipole from the surrounding environment by mounting the dipole on a non-conducting stand.

* * * * *